United States Patent
Yang

(10) Patent No.: US 11,817,509 B2
(45) Date of Patent: Nov. 14, 2023

(54) THIN FILM TRANSISTOR, METHOD FOR MANUFACTURING THE THIN FILM TRANSISTOR AND DISPLAY DEVICE COMPRISING THE THIN FILM TRANSISTOR

(71) Applicant: LG Display Co., Ltd., Seoul (KR)

(72) Inventor: JeongSuk Yang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 178 days.

(21) Appl. No.: 17/394,204

(22) Filed: Aug. 4, 2021

(65) Prior Publication Data

US 2022/0115542 A1    Apr. 14, 2022

(30) Foreign Application Priority Data

Oct. 12, 2020    (KR) .................. 10-2020-0131180

(51) Int. Cl.
*H01L 27/12* (2006.01)
*H01L 29/786* (2006.01)
(Continued)

(52) U.S. Cl.
CPC .. *H01L 29/78696* (2013.01); *H01L 21/02565* (2013.01); *H01L 21/426* (2013.01);
(Continued)

(58) Field of Classification Search
CPC ............. H01L 21/02565; H01L 21/426; H01L 21/3221; H01L 27/1225; H01L 27/127;
(Continued)

(56) References Cited

U.S. PATENT DOCUMENTS 6,288,413 B1    9/2001    Kamiura et al.
6,306,693 B1    10/2001    Ishiguro et al.
(Continued)

FOREIGN PATENT DOCUMENTS

JP          H08-51207 A       2/1996
KR    10-2013-0066410 A       6/2013
(Continued)

OTHER PUBLICATIONS

European Patent Office, Extended European Search Report, EP Patent Application No. 21196330.1, dated Jul. 6, 2022, ten pages.
(Continued)

*Primary Examiner* — Nikolay K Yushin
(74) *Attorney, Agent, or Firm* — Fenwick & West LLP

(57) ABSTRACT

A thin film transistor includes an active layer, a gate electrode spaced apart from and partially overlapped with the active layer, and a gate insulating film between the active layer and the gate electrode, wherein the active layer includes a channel portion overlapped with the gate electrode, a conductorization portion which is not overlapped with the gate electrode, and a gradient portion between the channel portion and the conductorization portion and not overlapped with the gate electrode, the conductorization portion and the gradient portion of the active layer are doped with a dopant, the gate insulating film covers an upper surface of the active layer facing the gate electrode during doping of the active layer, and in the gradient portion, a concentration of the dopant increases along a direction from the channel portion toward the conductorization portion. A display device may also include the thin film transistor.

26 Claims, 18 Drawing Sheets

(51) Int. Cl.
   *H01L 21/02*   (2006.01)
   *H01L 21/426*  (2006.01)
   *H01L 29/66*   (2006.01)
   *G09G 3/3233*  (2016.01)

(52) U.S. Cl.
   CPC ........ *H01L 27/127* (2013.01); *H01L 27/1225* (2013.01); *H01L 29/66969* (2013.01); *H01L 29/7869* (2013.01); *H01L 29/78603* (2013.01); *G09G 3/3233* (2013.01); *G09G 2300/0842* (2013.01)

(58) Field of Classification Search
   CPC ............. H01L 27/3258; H01L 27/3262; H01L 29/78696; H01L 29/66969; H01L 29/78603; H01L 29/7869; G09G 3/3233; G09G 3/30; G09G 3/3241; G09G 2300/0842; G09G 2300/0417; G09G 2300/021
   See application file for complete search history.

(56) References Cited

U.S. PATENT DOCUMENTS

| | | | |
|---|---|---|---|
| 6,395,571 | B1 | 5/2002 | Yi et al. |
| 9,443,984 | B2 * | 9/2016 | Yamazaki ......... H01L 29/78693 |
| 9,530,894 | B2 * | 12/2016 | Koezuka ............ H01L 27/1251 |
| 9,768,204 | B2 | 9/2017 | Lin et al. |
| 10,192,897 | B2 | 1/2019 | Lin et al. |
| 10,276,606 | B2 | 4/2019 | Lin et al. |
| 10,319,752 | B2 | 6/2019 | Kao et al. |
| 10,529,786 | B2 * | 1/2020 | Bang ................. H01L 29/78675 |
| 10,978,498 | B2 | 4/2021 | Lin et al. |
| 11,289,518 | B2 | 3/2022 | Kao et al. |
| 2001/0031519 | A1 | 10/2001 | Ayres et al. |
| 2002/0145142 | A1 | 10/2002 | Chen et al. |
| 2012/0161125 | A1 * | 6/2012 | Yamazaki .............. H10B 12/00 257/E21.409 |
| 2012/0319114 | A1 | 12/2012 | Yamazaki et al. |
| 2013/0015448 | A1 | 1/2013 | Yang et al. |
| 2015/0228799 | A1 * | 8/2015 | Koezuka ................ H01L 27/124 257/43 |
| 2017/0084636 | A1 | 3/2017 | Lin et al. |
| 2017/0084639 | A1 | 3/2017 | Kao et al. |
| 2017/0084641 | A1 | 3/2017 | Lin et al. |
| 2017/0084642 | A1 | 3/2017 | Lin et al. |
| 2017/0125604 | A1 * | 5/2017 | Oshima ............... H01L 27/1225 |
| 2018/0006065 | A1 | 1/2018 | Lin et al. |
| 2018/0012946 | A1 * | 1/2018 | Bang ................. H01L 29/66757 |
| 2019/0109160 | A1 | 4/2019 | Lin et al. |
| 2019/0252418 | A1 | 8/2019 | Kao et al. |
| 2019/0312147 | A1 | 10/2019 | Lee et al. |
| 2021/0091233 | A1 | 3/2021 | Yang et al. |
| 2021/0336064 | A1 * | 10/2021 | Gu .................... H01L 29/66969 |

FOREIGN PATENT DOCUMENTS

| | | |
|---|---|---|
| TW | 200611412 A | 4/2006 |
| TW | 201721720 A | 6/2017 |

OTHER PUBLICATIONS

Kobayashi, K. et al., "A Novel Fabrication Method for Polycrystalline Silicon Thin-Film Transistors with a Self-Aligned Lightly Doped Drain Structure," Jpn. J. Appl. Phys., vol. 32, Jan. 1993, pp. 469-473.

Park, J.C. et al., "Highly Stable Transparent Amorphous Oxide Semiconductor Thin-Film Transistors Having Double-Stacked Active Layers," Advanced Materials, vol. 22, 2010, pp. 5512-5516.

Park, J.C. et al., "Improvement of the Performance and Stability of Oxide Semiconductor Thin-Film Transistors Using Double-Stacked Active Layers," IEEE Electron Device Letters, 33(6), Jun. 2012, pp. 818-820.

Taiwan Intellectual Property Office, Office Action, TW Patent Application No. 110125390, dated Jun. 16, 2022, 14 pages.

* cited by examiner

THIN FILM TRANSISTOR, METHOD FOR MANUFACTURING THE THIN FILM TRANSISTOR AND DISPLAY DEVICE COMPRISING THE THIN FILM TRANSISTOR

CROSS-REFERENCE TO RELATED APPLICATIONS

This application claims the benefit of Republic of Korea Patent Application No. 10-2020-0131180 filed on Oct. 12, 2020, which are hereby incorporated by reference as if fully set forth herein.

BACKGROUND

Field

The present disclosure relates to a thin film transistor, a method for manufacturing the thin film transistor, and a display device including the thin film transistor, and more particularly, to a thin film transistor that may be driven even by a short channel due to a gradient portion of an active layer, a method for manufacturing the thin film transistor and a display device comprising the thin film transistor.

Discussion of the Related Art

Since a thin film transistor may be manufactured on a glass substrate or a plastic substrate, the thin film transistor has been widely used as a switching element or a driving element of a display device such as a liquid crystal display device or an organic light emitting device.

The thin film transistor may be categorized into an amorphous silicon thin film transistor in which amorphous silicon is used as an active layer, a polycrystalline silicon thin film transistor in which polycrystalline silicon is used as an active layer, and an oxide semiconductor thin film transistor in which oxide semiconductor is used as an active layer, based on a material constituting the active layer.

Since amorphous silicon may be deposited in a short time to form an active layer, an amorphous silicon thin film transistor (a-Si TFT) has advantages in that a manufacturing process time is short and a production cost is low. On the other hand, the amorphous silicon thin film transistor has a drawback in that it is restrictively used for an active matrix organic light emitting diode (AMOLED) because a current driving capacity is not good due to low mobility and there is a change in a threshold voltage.

A polycrystalline silicon thin film transistor (poly-Si TFT) is made by depositing amorphous silicon and crystallizing the deposited amorphous silicon. The polycrystalline silicon thin film transistor has advantages in that electron mobility is high, stability is excellent, thin profile and high resolution may be embodied, and power efficiency is high. Examples of the polycrystalline silicon thin film transistor include a low temperature poly silicon (LTPS) thin film transistor and a polysilicon thin film transistor. However, since a process of manufacturing the polycrystalline silicon thin film transistor needs a step of crystallizing the amorphous silicon, a manufacturing cost increases due to the increased number of the process steps, and crystallization is required at a high temperature. Therefore, it is difficult to apply the polycrystalline silicon thin film transistor to a large-sized display device. It is also difficult to make sure of uniformity of the polycrystalline silicon thin film transistor due to polycrystalline characteristics.

An oxide semiconductor thin film transistor (TFT), which has high mobility and has a large resistance change in accordance with an oxygen content, has an advantage in that desired properties may easily be obtained. Further, since an oxide constituting an active layer may be grown at a relatively low temperature during a process of manufacturing the oxide semiconductor thin film transistor, the manufacturing cost of the oxide semiconductor thin film transistor is reduced. Furthermore, in view of the properties of oxide, since an oxide semiconductor is transparent, it is favorable to embody a transparent display. However, the oxide semiconductor thin film transistor has a problem in that stability and mobility are deteriorated as compared with the polycrystalline silicon thin film transistor.

The oxide semiconductor thin film transistor may be manufactured in a back channel etch (BCE) structure or an etch stopper (ES) structure, which is a bottom gate type, or may be manufactured in a coplanar structure which is a top gate type. In case of an oxide semiconductor thin film transistor of a coplanar structure, it is important to control a conductorization area to make sure of a channel length, and it is required to manage a process condition for forming a conductorization area.

SUMMARY

The present disclosure has been made in view of the above problems, and it is an object of the present disclosure to provide a thin film transistor that has excellent electrical stability and may be driven even by a short channel resulted from that an active layer has a gradient portion between a channel portion and a conductorization portion and the gradient portion has a first area and a second area.

It is another object of the present disclosure to provide a thin film transistor that may efficiently make sure of an effective channel length due to a gradient portion that includes a first area and a second area.

It is still another object of the present disclosure to provide a thin film transistor that includes a conductorization portion formed by doping without patterning of a gate insulating film.

It is further still another object of the present disclosure to provide a display device including such a thin film transistor.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a thin film transistor including an active layer, a gate electrode spaced apart from the active layer and partially overlapped with the active layer, and a gate insulating film between the active layer and the gate electrode, wherein the gate insulating film covers an upper surface of the active layer headed for the gate electrode, the active layer includes a channel portion overlapped with the gate electrode, a conductorization portion which is not overlapped with the gate electrode, and a gradient portion between the channel portion and the conductorization portion, the gradient portion does not overlap the gate electrode, the conductorization portion and the gradient portion are doped by a dopant, and in the gradient portion, a concentration of the dopant increases along a direction from the channel portion toward the conductorization portion.

The gradient portion may include a first area and a second area, the first area may adjoin the channel portion, the second area may adjoin the conductorization portion, a concentration gradient of the dopant in a first portion of the first area, which adjoins the channel portion, may be greater than that in the second area, and a concentration gradient of the dopant in a second portion except the first portion of the first area adjoining the channel portion may be smaller than that in the second area.

The first area may have a concentration profile of a stair shape. For example, in the first portion of the first area, which adjoins the channel portion, a dopant concentration may be changed in a stepwise manner.

The second portion except the first portion of the first area may not have a concentration gradient of a dopant.

The concentration gradient of the dopant may be uniform in the second area.

The dopant may include a first dopant and a second dopant, and a concentration of the second dopant may be uniform in the conductorization portion and the gradient portion.

The first dopant may have a concentration gradient in the gradient portion.

The gradient portion may include a first area and a second area, the first area may adjoin the channel portion, the second area may adjoin the conductorization portion, and the first area may not include the first dopant.

The concentration of the second dopant may be uniform in the first area and the second area.

Specific resistance of the gradient portion may be lower than that of the channel portion and higher than that of the conductorization portion.

The dopant may include at least one of B, P, F or H.

The thin film transistor may further comprise a substrate, and a buffer layer disposed between the substrate and the active layer, wherein the buffer layer may include the dopant.

In area overlapped with the conductorization portion, a maximum dopant concentration of the buffer layer may be higher than a dopant concentration of the conductorization portion and a dopant concentration of the gate insulating film.

In an area overlapped with the conductorization portion, a dopant concentration of the conductorization portion may be higher than a dopant concentration of the gate insulating film and a dopant concentration of the buffer layer.

The active layer may include an oxide semiconductor material.

The active layer may include a first oxide semiconductor layer, and a second oxide semiconductor layer on the first oxide semiconductor layer.

The thin film transistor may further comprise a source electrode and a drain electrode, which are spaced apart from each other and respectively connected with the active layer.

The source electrode and the drain electrode may be disposed on the same layer as the gate electrode, and may be made of the same material as that of the gate electrode.

In accordance with another aspect of the present disclosure, the above and other objects can be accomplished by the provision of a method for manufacturing a thin film transistor including forming an active layer, forming a gate insulating film on the active layer, forming a gate electrode partially overlapped with the active layer, on the gate insulating film, and doping a dopant on the active layer, wherein the gate insulating film covers an upper surface of the active layer headed for the gate electrode, forming the gate electrode includes forming a material layer for the gate electrode on the gate insulating film, forming a photoresist pattern on the material layer for the gate electrode, and etching the material layer for the gate electrode by using the photoresist pattern as a mask, an area of the photoresist pattern is greater than that of the gate electrode in a plan view, the gate electrode is disposed in an area defined by the photoresist pattern in a plan view, and doping the dopant on the active layer includes first doping using the photoresist pattern as a mask, and second doping using the gate electrode as a mask after removing the photoresist pattern.

The photoresist pattern may be formed to be protruded to the outside of the area defined by the gate electrode, and a sum of lengths of the photoresist pattern protruded from the gate electrode at both sides of the gate electrode may range from 1.5 μm to 3.3 μm.

The dopant may include at least one of B, P, F or H.

A dopant used for the first doping and a dopant used for the second doping may be the same with each other.

A dopant used for the first doping and a dopant used for the second doping may be different from each other.

A doping concentration of the second doping may be lower than that of the first doping.

The second doping may not conductorize the channel portion.

In accordance with other aspect of the present disclosure, the above and other objects can be accomplished by the provision of a display device comprising the above thin film transistor.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
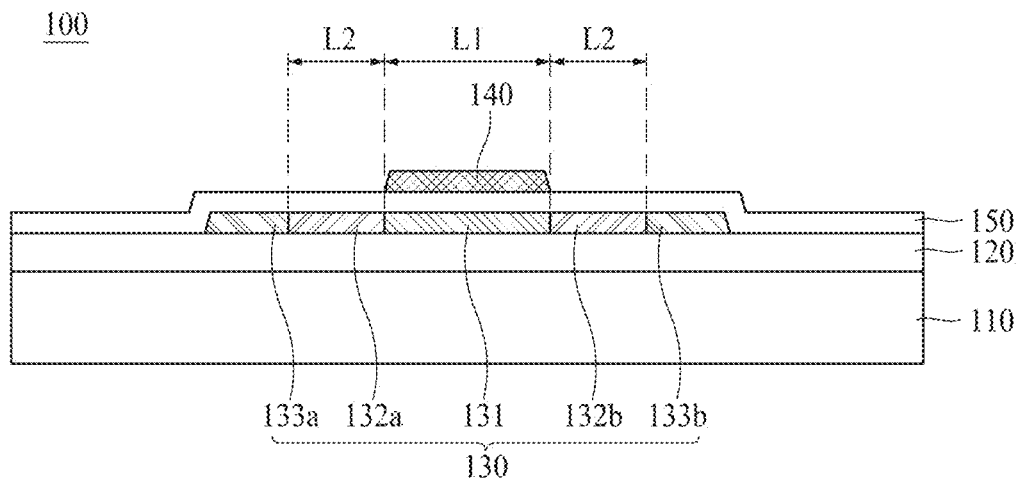
FIG. 1 is across-sectional view illustrating a thin film transistor according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above', 'below~', and 'next to~', one or more portions may be arranged between two other portions unless 'just' or 'direct' is used.

Spatially relative terms such as "below", "beneath", "lower", "above", and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below", or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the drawings, the same or similar elements are denoted by the same reference numerals even though they are depicted in different drawings.

In the embodiments of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In some embodiments of the present disclosure, for convenience of description, a source region is distinguished from a source electrode, and a drain region is distinguished from a drain electrode. However, the embodiments of the present disclosure are not limited to this structure. For example, the source region may be the source electrode, and the drain region may be the drain electrode. Also, the source region may be the drain electrode, and the drain region may be the source electrode.

FIG. 1 is a cross-sectional view illustrating a thin film transistor 100 according to one embodiment of the present disclosure.

The thin film transistor 100 according to one embodiment of the present disclosure includes an active layer 130, a gate electrode 140 spaced apart from the active layer 130 to partially overlap the active layer 130, and a gate insulating film 150 between the active layer 130 and the gate electrode 140. The gate insulating film 150 covers an upper surface of the active layer 130 facing the gate electrode 140. The gate insulating film 150 may cover an entire upper surface of the active layer 130.

The active layer 130 includes a channel portion 131 overlapped with the gate electrode 140, conductorization portions 133a and 133b which are not overlapped with the gate electrode 140, and gradient portions 132a and 132b between the channel portion 131 and the conductorization portions 133a and 133b. The gradient portions 132a and 132b may not be overlapped with the gate electrode 140, and the conductorization portions 133a and 133b and the gradient portions 132a and 132b are doped with a dopant.

According to one embodiment of the present disclosure, a concentration of a dopant in the gradient portions 132a and 132b increases along a direction from the channel portion 131 toward the conductorization portions 133a and 133b.

Referring to FIG. 1, the gradient portions 132a and 132b include a first gradient portion 132a and a second gradient portion 132b.

Hereinafter, the thin film transistor 100 according to one embodiment of the present disclosure will be described in more detail with reference to FIGS. 1 and 2.

Figure 2:
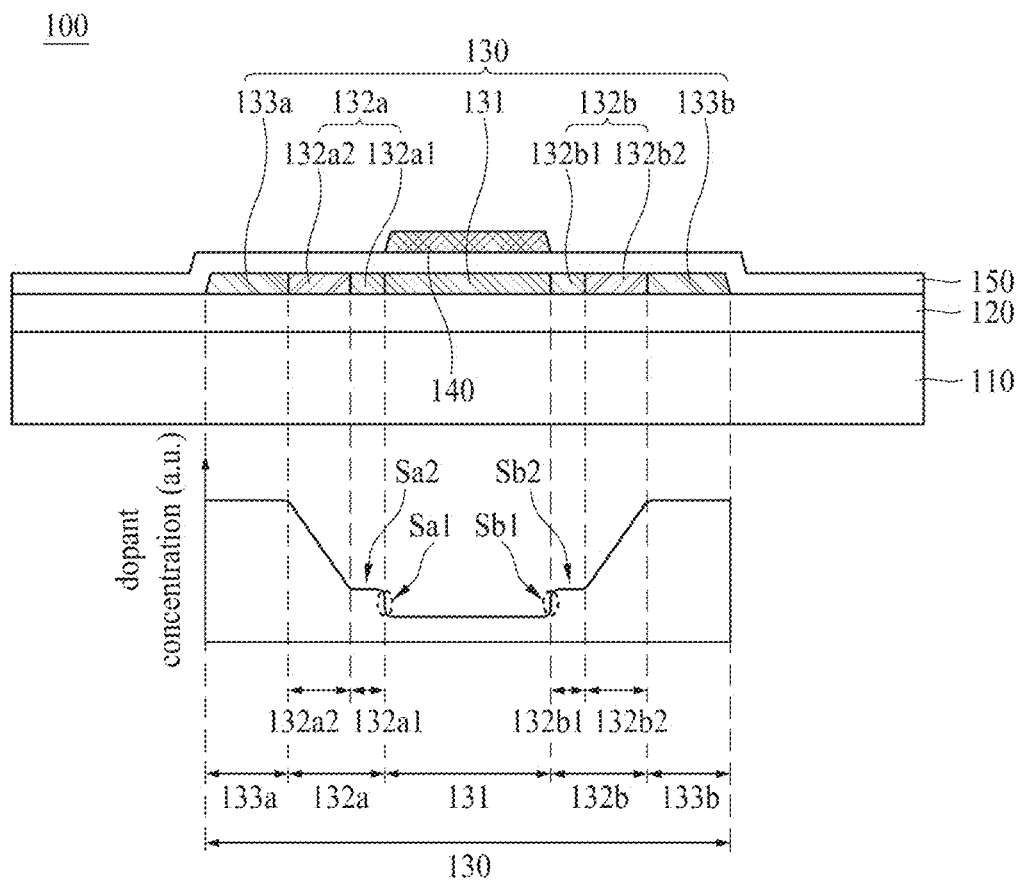
FIG. 2 is a schematic view illustrating that dopant concentrations are compared with each other in respective areas of an active layer.

Referring to FIGS. 1 and 2, the active layer 130 is disposed on a substrate 110.

Glass or plastic may be used as the substrate 110. A transparent plastic having flexible characteristics, for example, polyimide may be used as the plastic. When polyimide is used as the substrate 110, considering that a high temperature deposition process is performed on the substrate 110, heat-resistant polyimide that may be tolerable at a high temperature may be used.

A buffer layer 120 may be disposed on the substrate 110. The buffer layer 120 may include at least one of silicon oxide or silicon nitride. The buffer layer 120 may protect the active layer 130, and may planarize an upper portion of the substrate 110 due to its planarization characteristics. The buffer layer 120 may be omitted.

According to one embodiment of the present disclosure, the active layer 130 includes an oxide semiconductor material. The active layer 130 may be an oxide semiconductor layer.

The active layer 130 may include at least one of IZO (InZnO)-based, IGO(InGaO)-based, ITO(InSnO)-based, IGZO(InGaZnO)-based, IGZTO(InGaZnSnO)— based, ITZO(InSnZnO)-based, IGTO(InGaSnO)-based, GO(GaO)-based, GZTO(GaZnSnO)-based or GZO(GaZnO)-based oxide semiconductor materials. However, an embodiment of the present disclosure is not limited to this example, and the active layer 130 may be made of another oxide semiconductor material known in the art.

The active layer 130 includes a channel portion 131, conductorization portions 133a and 133b, and gradient portions 132a and 132b disposed between the channel portion 131 and the conductorization portions 133a and 133b.

The gate insulating film 150 is disposed on the active layer 130. The gate insulating film 150 has insulation property, and may include at least one of a silicon oxide, a silicon nitride or a metal-based oxide. The gate insulating film 150 may have a single film structure or a multi-layered film structure.

The gate insulating film 150 may cover the entire upper surface of the active layer 130. In FIG. 1, a surface of the active layer 130 disposed in a direction of the gate electrode 140 will be referred to as an upper surface. According to one embodiment of the present disclosure, as shown in FIGS. 1 and 2, the gate insulating film 150 may be formed to cover the entire surface on the substrate 110 including the active layer 130 without being patterned.

However, an embodiment of the present disclosure is not limited to FIGS. 1 and 2, and a contact hole may be formed in the gate insulating film 150. When a contact hole is formed in the gate insulating film 150, the active layer 130 may partially be exposed from the gate insulating film 150 by the contact hole. According to one embodiment of the present disclosure, the gate insulating film 150 may cover the entire upper surface of the active layer 130 except an area corresponding to the contact hole.

Also, according to one embodiment of the present disclosure, the gate insulating film 150 may cover the entire upper surface of the active layer 130 except an area of the active layer 130, which is in contact with a conductor. In this case, the conductor means elements made of a conductive material that is in contact with or connected with the active layer 130, and includes a line, an electrode, a pad, a terminal, etc. As the conductor, for example, there are a source electrode and a drain electrode, which are connected with the active layer 130.

According to one embodiment of the present disclosure, the gate insulating film 150 is disposed to cover an upper surface of the channel portion 131 of the active layer 130 and an upper surface of the gradient portions 132a and 132b.

According to one embodiment of the present disclosure, the active layer 130 may selectively be conductorized by doping based on a dopant. The dopant may be doped in the active layer 130 by passing through the gate insulating film 150. Therefore, even though the active layer 130 is not exposed from the gate insulating film 150, doping may be performed for the active layer 130. Therefore, according to one embodiment of the present disclosure, the gate insulating film 150 may not be patterned.

The gate electrode 140 is disposed on the gate insulating film 150. The gate electrode 140 may include at least one of Al, Al-based metal such as Al alloy, Ag, Ag-based metal such as Ag alloy, Cu, Cu-based metal such as Cu alloy, Mo, Mo-based metal such as Mo alloy, Cr, Ta, Nd or Ti. The gate electrode 140 may have a multi-layered film structure that includes at least two conductive films having their respective physical properties different from each other.

The gate electrode 140 overlaps the channel portion 131 of the active layer 130. A portion of the active layer 130, which overlaps the gate electrode 140, may be the channel portion 131. According to one embodiment of the present disclosure, the portion of the active layer 130, which overlaps the gate electrode 140, will be referred to as the channel portion 131.

The conductorization portions 133a and 133b may not overlap the gate electrode 140. Referring to FIGS. 1 and 2, the conductorization portions 133a and 133b may include a first conductorization portion 133a and a second conductorization portion 133b, which are spaced apart from each other. The first conductorization portion 133a, which is any one of the conductorization portions 133a and 133b, may be a source region, and the second conductorization portion 133b, which is the other one of the conductorization portions 133a and 133b, may be a drain region. As the case may be, the source region 133a may serve as a source electrode, and the drain region 133b may serve as a drain electrode. The conductorization portions 133a and 133b may serve as wiring lines.

According to one embodiment of the present disclosure, the conductorization portions 133a and 133b may be formed by selective conductorization for the active layer 130. For example, the conductorization portions 133a and 133b may be formed by doping based on a dopant. According to one embodiment of the present disclosure, the conductorization portions 133a and 133b are doped with the dopant.

The dopant may include at least one of B, P, F or H. For doping, at least one of B ion, P ion or F ion may be used. For doping, H ion may also be used.

The conductorization portions 133a and 133b have a dopant concentration higher than that of the channel portion 131, and have specific resistance lower than that of the channel portion 131. The conductorization portions 133a and 133b may have electrical conductivity higher than those of the channel portion 131 and the gradient portions 132a and 132b, or may have electrical conductivity similar to that of a conductor.

According to one embodiment of the present disclosure, the gradient portions 132a and 132b are disposed between the channel portion 131 and the conductorization portions 133a and 133b, and may not overlap the gate electrode 140. The gradient portions 132a and 132b have a concentration of a dopant increasing along a direction from the channel portion 131 toward the conductorization portions 133a and 133b.

A dopant concentration of each area of the active layer along the direction from the channel portion 131 toward the conductorization portions 133a and 133b is exemplarily shown in FIG. 2. In detail, FIG. 2 shows a concentration of a dopant along a line that sequentially connects the first conductorization portion 133a, the channel portion 131 and the second conductorization portion 133b with one another in a horizontal direction. The concentration of the dopant shown in FIG. 2 may be referred to as a "concentration of a plane direction" for convenience. Also, a concentration distribution state per horizontal position denoted by a graph as shown in FIG. 2 may be referred to as a "concentration profile."

According to one embodiment of the present disclosure, the gradient portions 132a and 132b include first areas 132a1 and 132b1 and second areas 132a2 and 132b2. The first areas 132a1 and 132b1 may adjoin the channel portion 131, and the second areas 132a2 and 132b2 may adjoin the conductorization portions 133a and 133b. In detail, the first gradient portion 132a includes the first area 132a1 and the second area 132a2, and the second gradient portion 132b includes the first area 132b1 and the second area 132b2.

Referring to FIG. 2, the concentration of the dopant is rapidly changed in first portions Sa1 and Sb1 of the first areas 132a1 and 132b1, which adjoin the channel portion 131. The concentration change rate of the dopant in the first portions Sa1 and Sb1, which adjoin the channel portion 131, of the first areas 132a1 and 132b1 is greater than that in the second areas 132a2 and 132b2. According to one embodiment of the present disclosure, a concentration gradient of the dopant in the first portions Sa1 and Sb1, which adjoin the channel portion 131, of the first areas 132a1 and 132b1 is greater than that in the second areas 132a2 and 132b2. According to one embodiment of the present disclosure, a concentration change rate of the dopant may be described by the concentration gradient of the dopant. The concentration gradient of the dopant may be defined as a ratio of a change of a concentration to a change of a distance (Δconcentration/Δdistance) based on the direction from the channel portion 131 toward the conductorization portions 133a and 133b.

The concentration of the dopant is little changed in the portions other than the first portions Sa1 and Sb1, which adjoin the channel portion 131, in the first areas 132a1 and 132b1. According to one embodiment of the present disclosure, the portions other than the first portions Sa1 and Sb1 in the first areas 132a1 and 132b1 may be referred as "second portions Sa2 and Sb2." The concentration change rate of the dopant in the second portions Sa2 and Sb2, which are other than the first portions Sa1 and Sb1 adjoining the channel portion 131, in the first areas 132a1 and 132b1 is smaller than that in the second areas 132a2 and 132b2. According to one embodiment of the present disclosure, the concentration gradient of the dopant in the second portions Sa2 and Sb2 other than the first portions Sa1 and Sb1 in the first areas 132a1 and 132b1 is smaller than that in the second areas 132a2 and 132b2.

Referring to FIG. 2, a dopant concentration is changed in a stepwise manner in the first portions Sa1 and Sb1, which adjoin the channel portion 131, of the first areas 132a1 and 132b1. In more detail, the first areas 132a1 and 132b1 may have a concentration profile of a stair shape. Referring to FIG. 2, the first areas 132a1 and 132b1 may have a concentration profile of a stair shape by a dopant concentration almost vertically changed in the first portions Sa1 and Sb1 that adjoin the channel portion 131 and a dopant concentration which is little changed in the second portions Sa2 and Sb2 that are not adjoined with the channel portion 131.

According to one embodiment of the present disclosure, as shown in FIG. 2, the first areas 132a1 and 132b1 include an area having no concentration gradient of the dopant, which is in the second portions Sa2 and Sb2. In detail, there is no concentration change of the dopant in the second portions Sa2 and Sb2 which are other than the first portions Sa1 and Sb1 of the first areas 132a1 and 132b1. Therefore, the second portions Sa2 and Sb2 other than the first portions Sa1 and Sb1 of the first areas 132a1 and 132b1 may not have a concentration gradient of the dopant.

Referring to FIG. 2, it is noted from the second areas 132a2 and 132b2 that the dopant concentration is uniformly increasing along the direction from the channel portion 131 toward the conductorization portions 133a and 133b. Therefore, according to one embodiment of the present disclosure, the concentration gradient of the dopant may be uniform in the second areas 132a2 and 132b2.

According to one embodiment of the present disclosure, doping for the active layer 130 may be performed twice or more during the manufacturing process of the thin film transistor 100.

Figure 3:
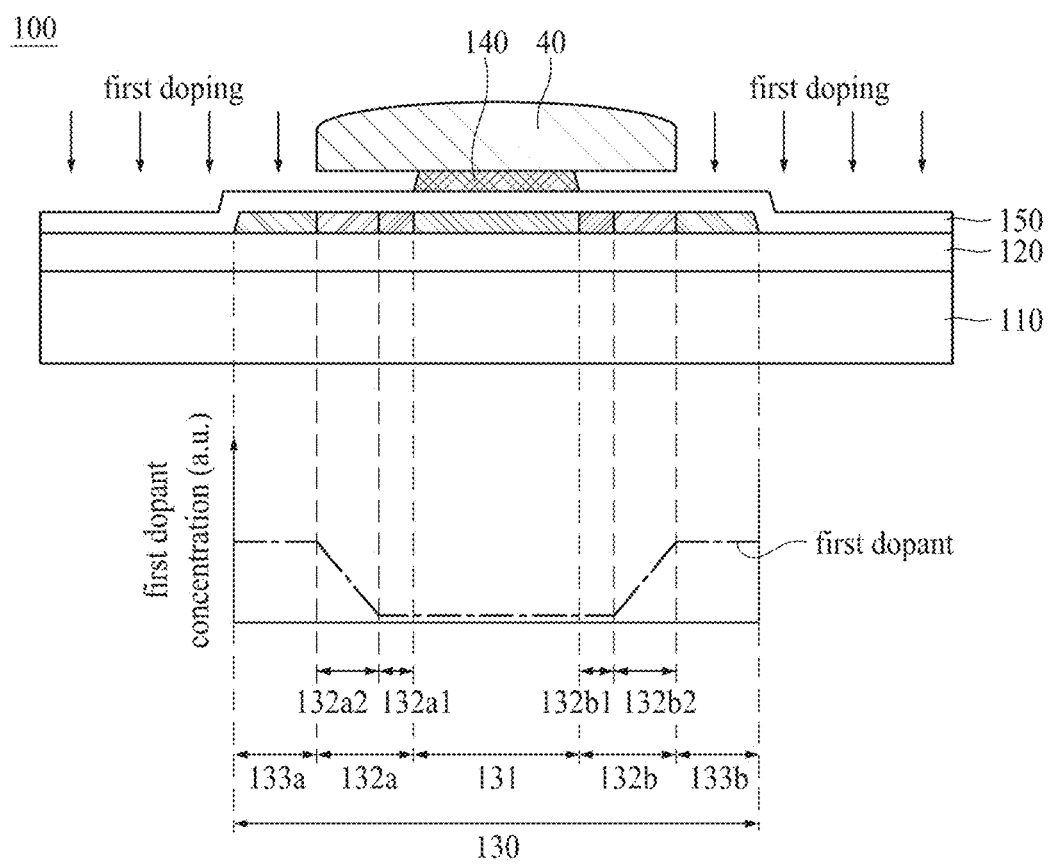
FIG. 3 is a schematic view illustrating first doping according to an embodiment.

FIG. 3 is a schematic view illustrating first doping. Referring to FIG. 3, the first doping may be performed for the active layer 130 by using a photoresist pattern 40 used for formation of the gate electrode 140 as a mask.

A dopant is used for the first doping. The dopant may include at least one of B, P, F or H. For example, at least one of B, P or F may be used as the dopant, or H may also be used. The dopant may be doped at an ion state. According to one embodiment of the present disclosure, the first doping may be performed by ion doping through ion implantation.

For the doping process, the photoresist pattern 40 remaining on the gate electrode 140 may serve as a mask for protecting the channel portion 131.

Referring to FIG. 3, based on a sectional view, the photoresist pattern 40 may have a length longer than that of the gate electrode 140. Based on a plane view, the photoresist pattern 40 may have an area greater than that of the gate electrode 140. For example, in a plan view, the gate electrode 140 may be disposed within an area defined by the photoresist pattern 40.

According to one embodiment of the present disclosure, a material layer for the gate electrode may be formed on the gate insulating film 150, and may be etched using the photoresist pattern 40 as a mask to form the gate electrode 140. In this case, the material layer for the gate electrode may be etched to the inside of an edge of the photoresist pattern 40, whereby the gate electrode 140 having an area smaller than that of the photoresist pattern 40 may be formed.

As shown in FIG. 3, the area of the active layer 130, which does not overlap the photoresist pattern 40, is doped with a dopant by doping using the photoresist pattern 40 as a mask. As a result, the conductorization portions 133*a* and 133*b* are formed.

The channel portion 131 protected by the photoresist pattern 40 is not doped with a dopant. As a result, the channel portion 131 may maintain semiconductor characteristics.

Referring to FIG. 3, the gradient portions 132*a* and 132*b* are protected by the photoresist pattern 40. Therefore, the dopant is prevented from being directly injected into the gradient portions 132*a* and 132*b*. However, the dopants doped in the conductorization portions 133*a* and 133*b* may be diffused to the gradient portions 132*a* and 132*b*. Therefore, an effect that the dopant is partially doped in the gradient portions 132*a* and 132*b* may occur.

As a result, as shown in a lower end portion of FIG. 3, a concentration profile of a dopant may be formed by the first doping. Hereinafter, the dopant used for the first doping will be referred to as a "first dopant."

According to one embodiment of the present disclosure, each of the first gradient portion 132*a* and the second gradient portion 132*b* may have a length corresponding to a length of the photoresist pattern 40 protruded from the gate electrode 140.

Next, second doping may be performed for the active layer 130.

Figure 4:
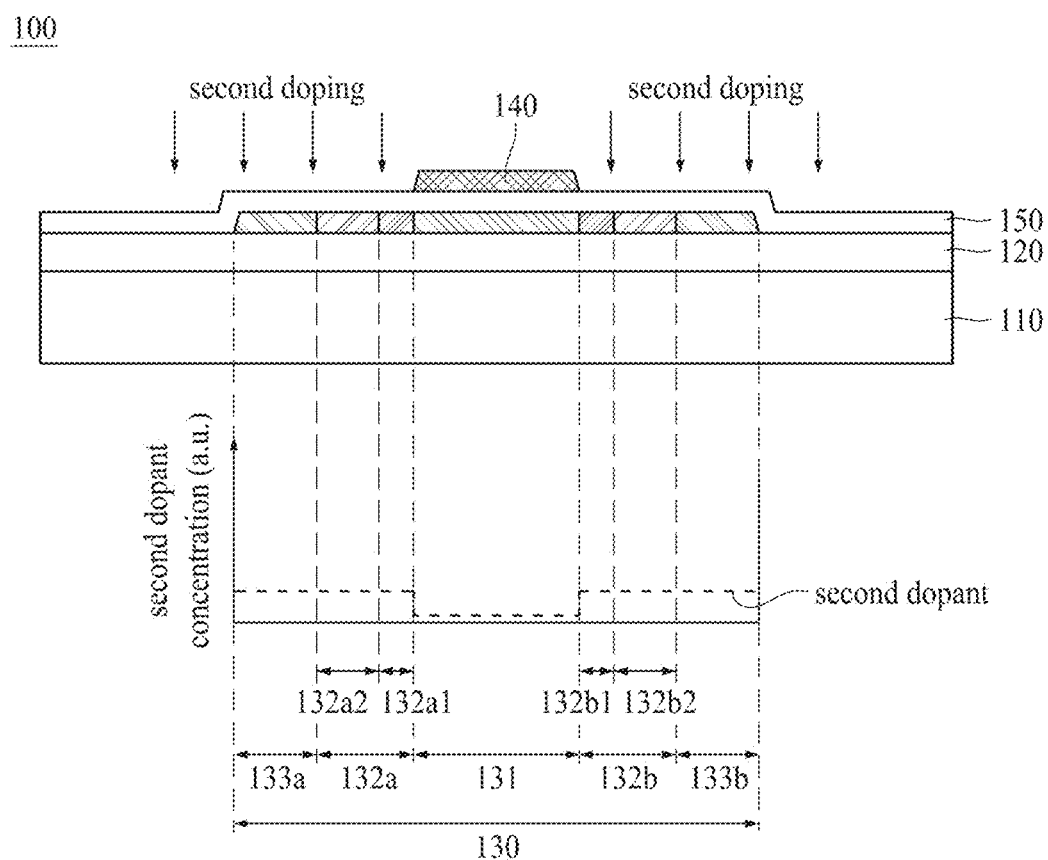
FIG. 4 is a schematic view illustrating second doping according to an embodiment.

FIG. 4 is a schematic view illustrating second doping. As shown in FIG. 4, the second doping is performed after the photoresist pattern 40 is removed. In the second doping, the gate electrode 140 serves as a mask.

The second doping is performed at an ion concentration lower than that of the first doping. The doping concentration of the second doping is lower than that of the first doping. Also, an ion acceleration energy for the second doping may be set to be lower than that for the first doping.

A dopant is used for the second doping. The dopant may include at least one of B, P, F or H. For example, at least one of B, P or F may be used as the dopant, or H may also be used. The dopant may be doped at an ion state. According to one embodiment of the present disclosure, the second doping may be performed by ion doping through ion implantation.

In the second doping step, the dopant may directly be doped in the gradient portions 132*a* and 132*b* and the conductorization portions 133*a* and 133*b*. Therefore, the dopant is also doped in the gradient portions 132*a* and 132*b* (see FIG. 14H). However, since the ion concentration of the second doping is low, the dopant applied to the second doping is not diffused to the channel portion 131, or is little diffused to the channel portion 131. The concentration of the dopant based on the second doping may equally be applied to the entire doping area except the channel portion 131. According to one embodiment of the present disclosure, the second doping does not conductorize the channel portion 131.

As a result, as shown in a lower end portion of FIG. 4, a concentration profile of the dopant based on the second doping may be formed. Hereinafter, the dopant used for the second doping will be referred to as a "second dopant."

Figure 5:
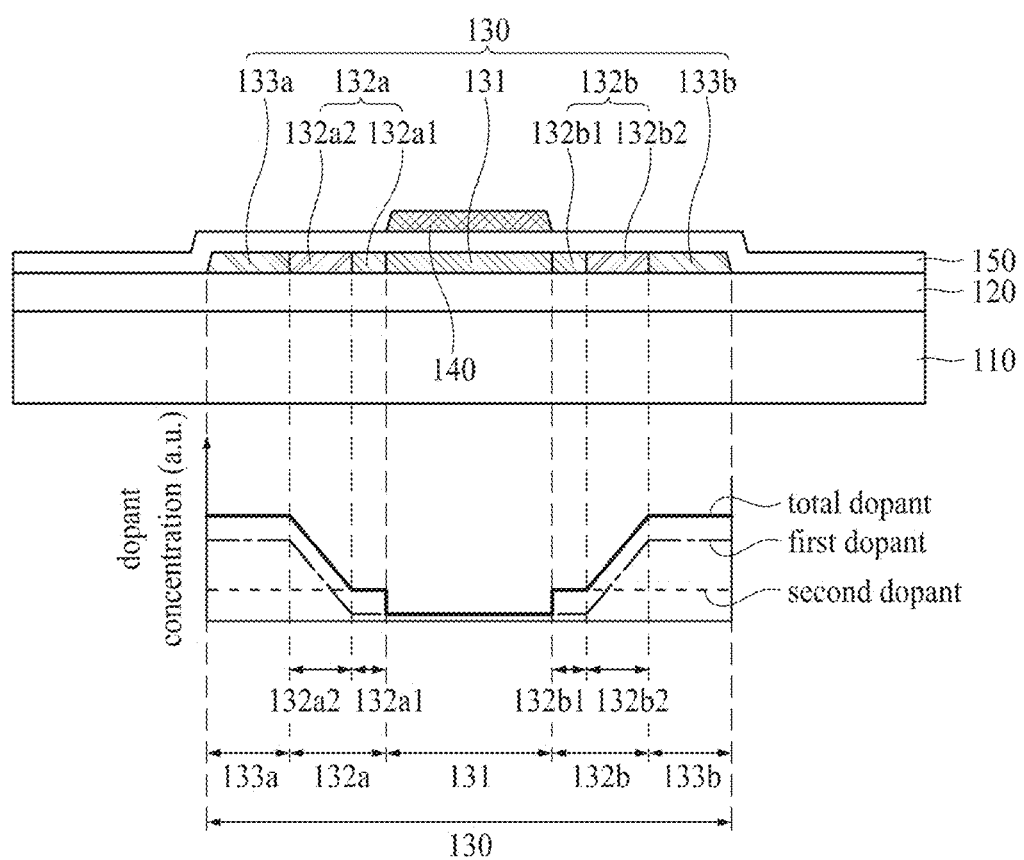
FIG. 5 is a schematic view illustrating that a concentration of a first dopant, a concentration of a second dopant, and a total dopant concentration are compared with one another in areas of an active layer.

FIG. 5 is a schematic view illustrating a concentration of a first dopant, a concentration of a second dopant, and a concentration of a total dopant compared with one another in each area of the active layer.

According to one embodiment of the present disclosure, the dopant may include a first dopant and a second dopant, and a concentration of the second dopant may be uniformly maintained in the conductorization portions 133*a* and 133*b* and the gradient portions 132*a* and 132*b*.

On the other hand, the first dopant may have a concentration gradient in the gradient portions 132*a* and 132*b*. Referring to FIGS. 3 and 5, the gradient portions 132*a* and 132*b* include first areas 132*a*1 and 132*b*1 and second areas 132*a*2 and 132*b*2. The first areas 132*a*1 and 132*b*1 adjoin the channel portion 131, the second areas 132*a*2 and 132*b*2 adjoin the conductorization portions 133*a* and 133*b*, and the first areas 132*a*1 and 132*b*1 may not include the first dopant. The first dopant may have a concentration gradient in the second areas 132*a*2 and 132*b*2 of the gradient portions 132*a* and 132*b*. According to one embodiment of the present disclosure, areas of the gradient portions 132*a* and 132*b*, which do not include the first dopant, may be defined as the first areas 132*a*1 and 132*b*1.

Also, the concentration of the second dopant may be uniform in the first areas 132*a*1 and 132*b*1 and the second areas 132*a*2 and 132*b*2.

Figure 6:
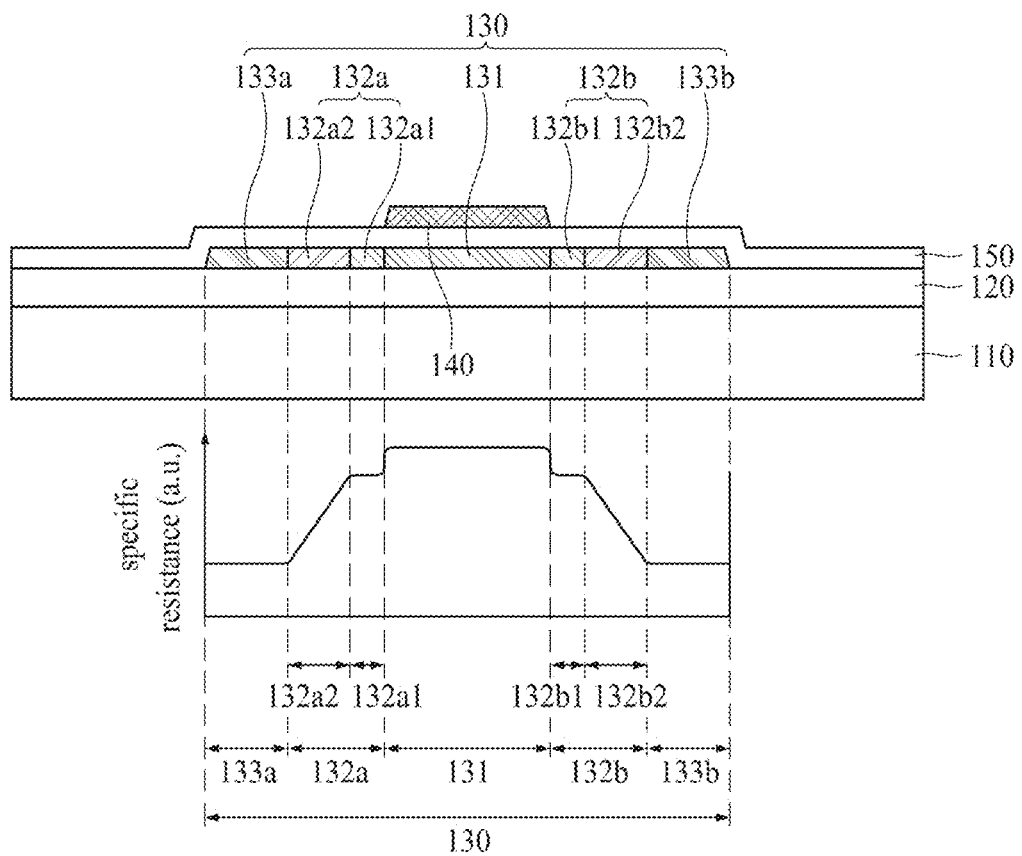
FIG. 6 is a schematic view illustrating comparison of specific resistance in respective areas of an active layer according to an embodiment.

FIG. 6 is a schematic view illustrating comparison of specific resistance in respective areas of the active layer 130.

According to one embodiment of the present disclosure, specific resistance of the gradient portions 132*a* and 132*b* is lower than that of the channel portion 131, and is higher than that of the conductorization portions 133*a* and 133*b*.

Referring to FIG. 6, specific resistance is rapidly changed in first portions Sa1 and Sb1, which adjoin the channel portion 131, of the first areas 132*a*1 and 132*b*1. The change rate of the specific resistance in the first portions Sa1 and Sb1, which adjoin the channel portion 131, of the first areas 132*a*1 and 132*b*1 is greater than that in the second areas 132*a*2 and 132*b*2. On the other hand, the change rate of the specific resistance in the second portions Sa2 and Sb2 other than the first portions Sa1 and Sb1 of the first areas 132*a*1 and 132*b*1 is smaller than that in the second areas 132*a*2 and 132*b*2.

Referring to FIG. 6, specific resistance is changed in a stepwise manner in the first portions Sa1 and Sb1, which adjoin the channel portion 131, of the first areas 132*a*1 and 132*b*1.

According to one embodiment of the present disclosure, as shown in FIG. 6, the first areas 132*a*1 and 132*b*1 may include an area having no change in specific resistance, which are second portions Sa2 and Sb2. For example, there is no change in specific resistance in the second portions Sa2 and Sb2, which are other than the first portions Sa1 and Sb1 of the first areas 132*a*1 and 132*b*1.

Referring to FIG. 6, it is noted from the second areas 132*a*2 and 132*b*2 that specific resistance is uniformly reduced along the direction from the channel portion 131 toward the conductorization portions 133*a* and 133*b*.

According to one embodiment of the present disclosure, since the ion concentration of the second doping is low, the dopant is not diffused to the channel portion 131. In this case, the second areas 132*a*2 and 132*b*2 may serve to control or buffer diffusion of the dopant. Therefore, a process margin of the channel portion 131, which should be set due to diffusion of the dopant, may be reduced or minimized, and a stable effective channel length may be obtained. Therefore, according to one embodiment of the present disclosure, even though a channel length is designed to be short, the thin film transistor 100 may be stably driven.

On the other hand, when the gradient portions 132a and 132b are short and the first doping is only performed, the first areas 132a1 and 132b1 are not formed, and thus an edge of the channel portion 131, which overlaps the gate electrode 140, is partially conductorized during the conductorizing process, whereby an effective channel length is reduced. Therefore, since a long length L1 of the channel portion 131 should be designed to make sure of a stable effective channel length, it is difficult to embody a short channel. Also, even though the channel portion 131 is directly connected with the conductorization portions 133a and 133b without the gradient portions 132a and 132b, the edge of the channel portion 131, which overlaps the gate electrode 140, is partially conductorized during the conductorizing process for the conductorization portions 133a and 133b, whereby an effective channel length is reduced. Therefore, since a long length L1 of the channel portion 131 should be designed to make sure of a stable effective channel length, it is difficult to embody a short channel.

According to one embodiment of the present disclosure, a length L2 of the gradient portions 132a and 132b is designed so as not to disturb driving of the thin film transistor 100 while preventing the edge of the channel portion 131 from being conductorized.

According to one embodiment of the present disclosure, a length of the first gradient portion 132a and a length of the second gradient portion 132b may be equal to each other or different from each other. In one embodiment of the present disclosure, for convenience, the length of the first gradient portion 132a and the length of the second gradient portion 132b are marked as L2 without being distinguished from each other.

According to one embodiment of the present disclosure, a sum of the lengths of the gradient portions 132a and 132b formed at both sides of the channel portion 131 may be 1.5 µm or more. When the sum of the lengths of the gradient portions 132a and 132b formed at both sides of the channel portion 131 is less than 1.5 µm, the edge of the channel portion 131 may be partially conductorized. In this case, "both sides" together refer to a left side and a right side based on the channel portion 131 in FIG. 6. For example, a direction of the source region 133a and a direction of the drain region 133b based on the channel portion 131 may be referred to as both sides of the channel portion 131. According to one embodiment of the present disclosure, the length L2 of any one of the gradient portions 132a and 132b may be 0.7 µm or more.

According to one embodiment of the present disclosure, each of the lengths L2 of the gradient portions 132a and 132b may be designed to be set to 2.5 µm or less. When the each of the lengths L2 of the gradient portions 132a and 132b exceeds 2.5 µm, ON-current characteristics of the thin film transistor 100 may be deteriorated, and it is unfavorable for miniaturization of the thin film transistor 100. According to one embodiment of the present disclosure, a sum of the lengths L2 of the gradient portions 132a and 132b may be designed to be set to 3.3 µm or less. When the sum of the lengths L2 of the gradient portions 132a and 132b exceeds 3.3 µm, ON-current characteristics of the thin film transistor 100 may be deteriorated, and it is unfavorable for miniaturization of the thin film transistor 100.

According to one embodiment of the present disclosure, since the gradient portions 132a and 132b, especially the first areas 132a1 and 132b1, are disposed between the channel portion 131 and the conductorization portions 133a and 133b, the entire channel portion 131 overlapped with the gate electrode 140 may serve as an effective channel.

Therefore, even though the length L1 of the channel portion 131 is designed to be short, the thin film transistor 100 may be effectively driven, and may be reduced or miniaturized.

Also, the gradient portions 132a and 132b may serve as electrical buffers between the conductorization portions 133a and 133b and the channel portion 131. In detail, since the first areas 132a1 and 132b1 having relatively high specific resistance are disposed between the channel portion 131 and the conductorization portions 133a and 133b, a leakage current may be prevented from flowing between the channel portion 131 and the conductorization portions 133a and 133b at an OFF state of the thin film transistor 100.

According to one embodiment of the present disclosure, the length of the channel portion 131 may be 1 µm or more. Also, according to one embodiment of the present disclosure, the length of the channel portion 131 may be 2 µm or more. According to one embodiment of the present disclosure, since the gradient portions 132a and 132b are disposed between the channel portion 131 and the conductorization portions 133a and 133b, even though the length L1 of the channel portion 131 is 2 µm or so, the thin film transistor 100 may serve to effectively perform a switching function. Particularly, due to the first areas 132a1 and 132b1 of the gradient portions 132a and 132b, even though the length L1 of the channel portion 131 is 1 µm or so, the thin film transistor 100 may serve to effectively perform a switching function. For example, the channel portion 131 may have a length of 1 µm to 10 µm, a length of 2 µm to 10 µm, a length of 1 µm to 6 µm, a length of 2 µm to 6 µm, a length of 1 µm to 4 µm, a length of 2 µm to 4 µm, a length of 3 µm to 10 µm, a length of 3 µm to 8 µm, or a length of 3 µm to 6 µm.

According to one embodiment of the present disclosure, the buffer layer 120 may be disposed between the substrate 110 and the active layer 130, and the dopant may be doped even in the buffer layer 120.

An acceleration voltage applied to the dopant during the doping process may be controlled, whereby the dopant concentration of the conductorization portions 133a and 133b, the dopant concentration of the gate insulating film 150 and the dopant concentration of the buffer layer 120 may be controlled.

In order that the dopant is sufficiently doped in the conductorization portions 133a and 133b, the acceleration voltage applied to the dopant may be increased. In this case, the dopant may be doped in the buffer layer 120 by passing through the conductorization portions 133a and 133b. When the concentration of the dopant doped in the buffer layer 120 increases, the dopant concentration of the buffer layer 120 may be higher than that of the conductorization portions 133a and 133b.

However, when the acceleration voltage for doping is increased more than it is needed, the active layer 130 may be damaged. Therefore, according to one embodiment of the present disclosure, the acceleration voltage is controlled such that the conductorization portions 133a and 133b have an increased or maximum dopant concentration or the upper portion of the buffer layer 120 may have a maximum dopant concentration.

According to one embodiment of the present disclosure, in the area overlapped with the conductorization portions 133a and 133b, the maximum value of the dopant concentration of the buffer layer 120 may be higher than that of the conductorization portions 133a and 133b and that of the gate insulating film 150.

According to one embodiment of the present disclosure, in the area overlapped with the conductorization portions 133a and 133b, the dopant concentration of the conductorization portions 133a and 133b may be higher than that of the gate insulating film 150 and that of the buffer layer 120.

According to one embodiment of the present disclosure, when the conductorization portions 133a and 133b have an increased or maximum dopant concentration or the buffer layer 120 has an increased or maximum dopant concentration, it may be considered that efficient doping has been performed for the conductorization portions 133a and 133b. Also, when the conductorization portions 133a and 133b have a maximum dopant concentration or the buffer layer 120 has a maximum dopant concentration, the thin film transistor 100 may be efficiently operated.

Figure 7A:
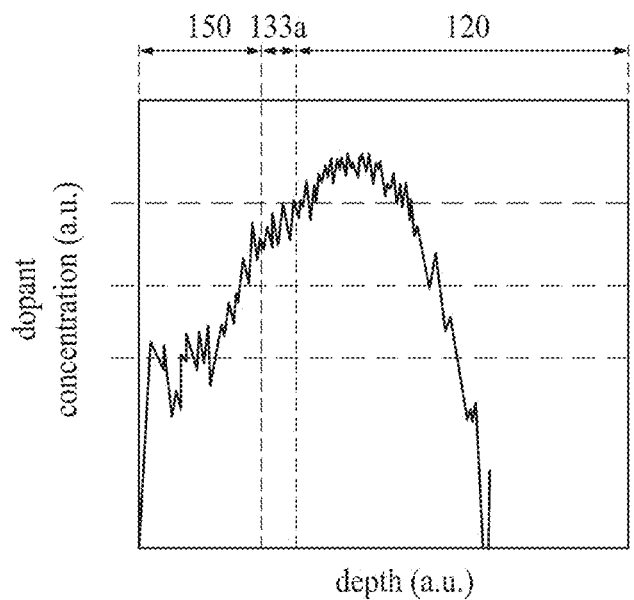
FIGS. 7A, 7B, and 7C are schematic views illustrating that concentrations of dopants in thickness direction of a thin film transistor are compared with one another.
Figure 7B:
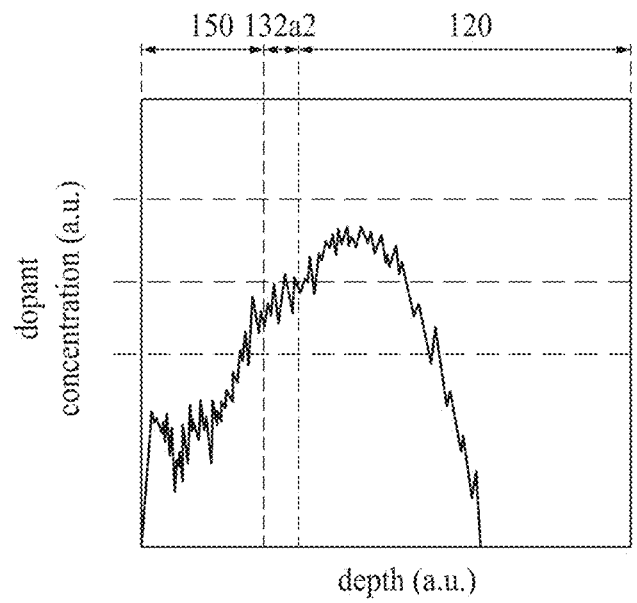
Figure 7C:
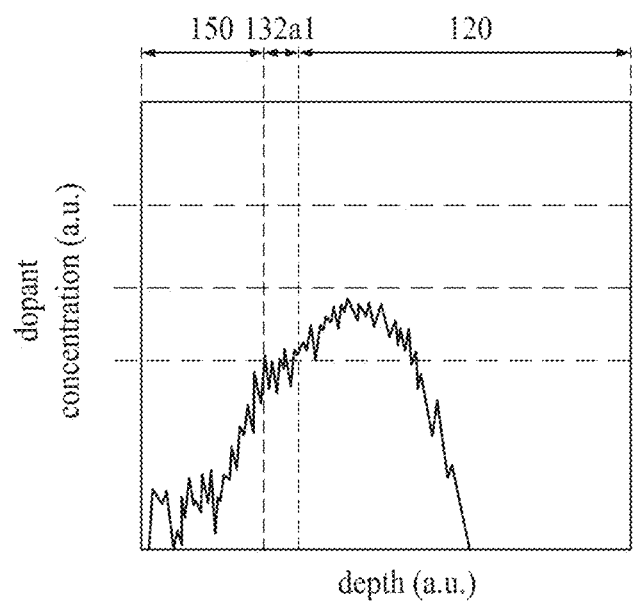

FIGS. 7A, 7B, and 7C are schematic views illustrating concentrations of dopants in thickness direction of a thin film transistor compared with one another.

FIG. 7A illustrates a concentration change of a dopant based on a depth in an area overlapped with the first conductorization portion 133a. In FIG. 7A, the depth is marked with a vertical distance from an upper surface of the gate insulating film 150 toward the substrate 110. In detail, in FIG. 7A, the depth of the upper surface of the gate insulating film 150 is defined as "0", and the depth increases toward the substrate 110.

A concentration of an element based on the depth may be identified by a D-SIMS Ion Profile.

Referring to FIG. 7A, in the area overlapped with the first conductorization portion 133a, the dopant concentration of the first conductorization portion 133a is higher than that of the gate insulating film 150. Also, in the area overlapped with the first conductorization portion 133a, the dopant concentration of the buffer layer 120 may be higher than that of the first conductorization portion 133a and that of the gate insulating film 150. In the area overlapped with the first conductorization portion 133a, the upper portion of the buffer layer 120 may have a maximum dopant concentration.

FIG. 7B illustrates a concentration change of a dopant based on a depth in an area overlapped with the second area 132a2 of the first gradient portion 132a. In the area overlapped with the second area 132a2 of the first gradient portion 132a, the upper portion of the buffer layer 120 may have a maximum dopant concentration.

FIG. 7C illustrates a concentration change of a dopant based on a depth in an area overlapped with the first area 132a1 of the first gradient portion 132a. In the area overlapped with the first area 132a1 of the first gradient portion 132a, the upper portion of the buffer layer 120 may have a maximum dopant concentration.

Figure 8:
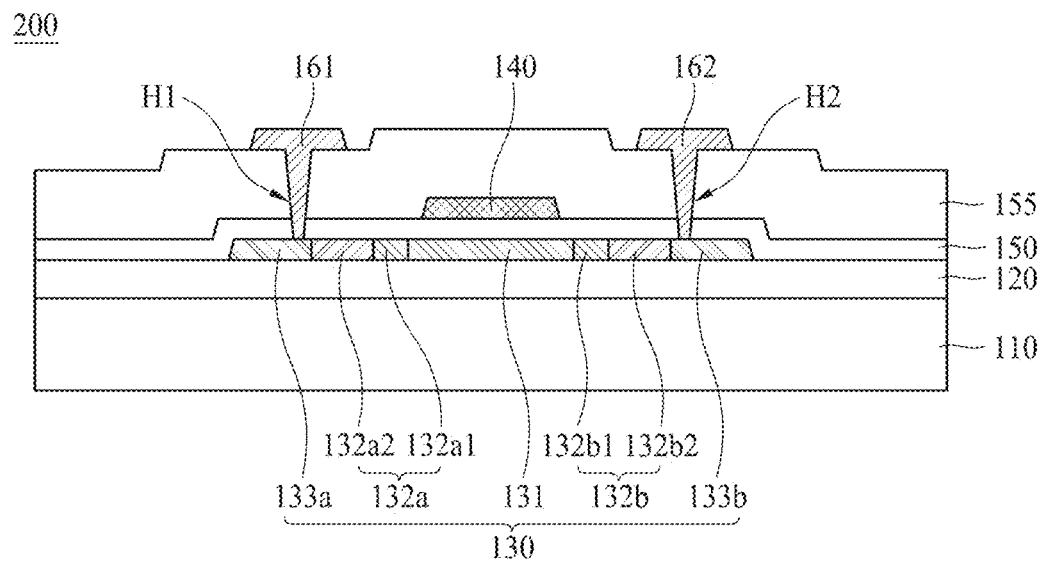
FIG. 8 is a cross-sectional view illustrating a thin film transistor according to another embodiment of the present disclosure.

FIG. 8 is a cross-sectional view illustrating a thin film transistor 200 according to another embodiment of the present disclosure.

The thin film transistor 200 shown in FIG. 8 further includes an inter-layer dielectric film 155, a source electrode 161 and a drain electrode 162 in comparison with the thin film transistor 100 shown in FIG. 1. The inter-layer dielectric film 155 may be disposed on the gate electrode 140 and the gate insulating film 150, and may be made of an insulating material.

The source electrode 161 and the drain electrode 162 are disposed on the inter-layer dielectric film 155. The source electrode 161 and the drain electrode 162 are spaced apart from each other and then connected with the active layer 130.

Referring to FIG. 8, the source electrode 161 is connected with the first conductorization portion 133a through a contact hole H1, and the drain electrode 162 is connected with the second conductorization portion 133b through a contact hole H2. The first conductorization portion 133a connected with the source electrode 161 may be referred to as a source connection portion, and the second conductorization portion 133b connected with the drain electrode 162 may be referred to as a drain connection portion.

Referring to FIG. 8, the contact holes H1 and H2 pass through the inter-layer dielectric film 155 and the gate insulating film 150. A portion of the active layer 130 may be exposed from the gate insulating film 150 by the contact holes H1 and H2. In detail, a portion of the first conductorization portion 133a and a portion of the second conductorization portion 133b may be exposed from the gate insulating film 150 by the contact holes H1 and H2.

Figure 9:
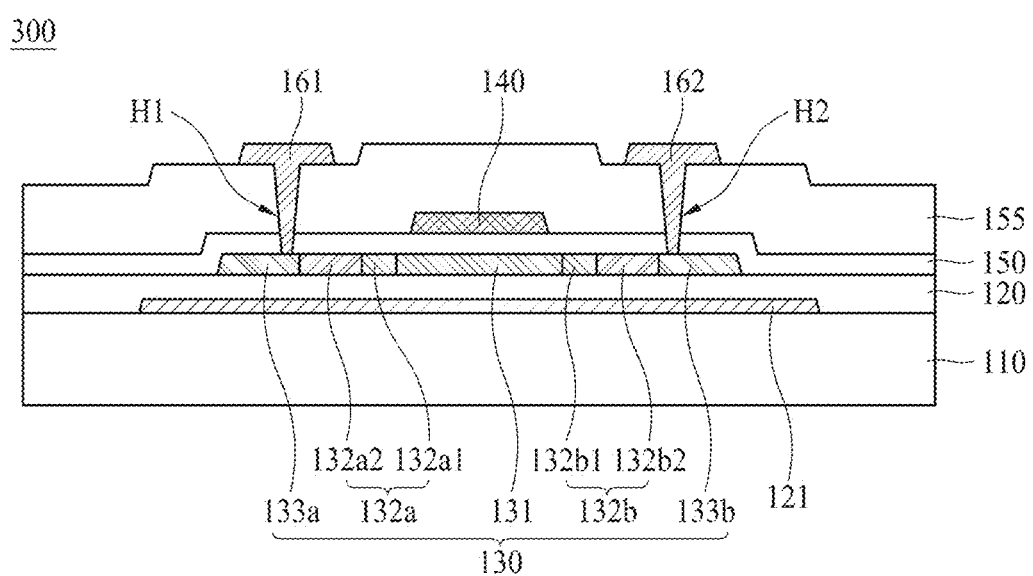
FIG. 9 is a cross-sectional view illustrating a thin film transistor according to another embodiment of the present disclosure.

FIG. 9 is a cross-sectional view illustrating a thin film transistor 300 according to another embodiment of the present disclosure.

Referring to FIG. 9, the thin film transistor 300 according to still another embodiment of the present disclosure includes a light shielding layer 121 disposed on the substrate 110. The light shielding layer 121 may be disposed to overlap the active layer 130 to shield light entering the active layer 130 through the substrate 110, thereby protecting the active layer 130. Particularly, the light shielding layer 121 is disposed to overlap the channel portion 131 of the active layer 130.

Figure 10:
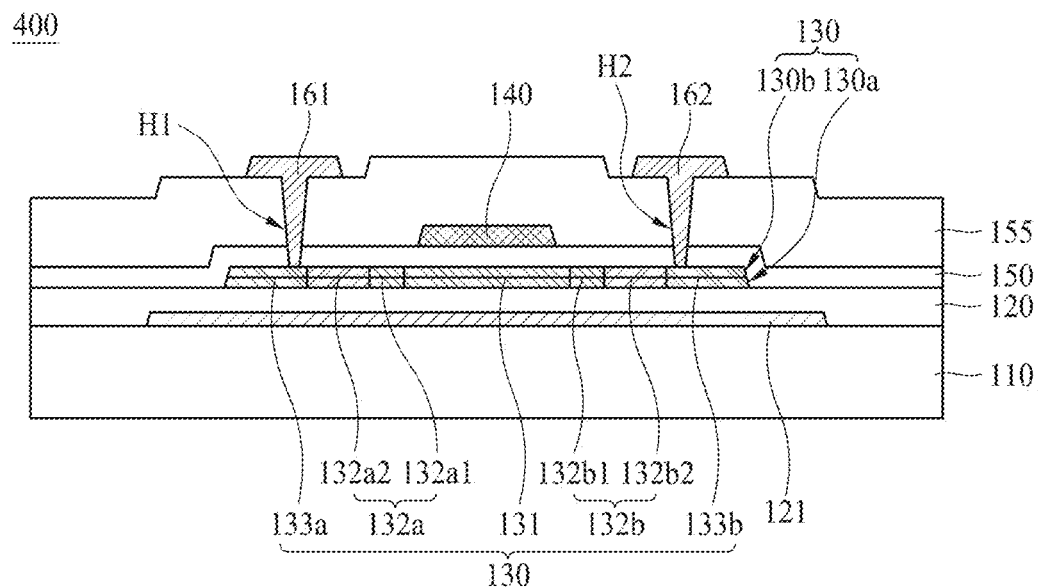
FIG. 10 is a cross-sectional view illustrating a thin film transistor according to another embodiment of the present disclosure.

FIG. 10 is a cross-sectional view illustrating a thin film transistor 400 according to another embodiment of the present disclosure.

Referring to FIG. 10, the active layer 130 has a multi-layered structure. The active layer 130 of the thin film transistor 400 according to FIG. 10 includes a first oxide semiconductor layer 130a, and a second oxide semiconductor layer 130b on the first oxide semiconductor layer 130a. Each of the first oxide semiconductor layer 130a and the second oxide semiconductor layer 130b includes an oxide semiconductor material. The first oxide semiconductor layer 130a and the second oxide semiconductor layer 130b may include the same oxide semiconductor material, or may include their respective oxide semiconductor materials different from each other.

The first oxide semiconductor layer 130a is disposed on the substrate 110, and supports the second oxide semiconductor layer 130b. Therefore, the first oxide semiconductor layer 130a may be referred to as a "support layer." A main channel is formed in the second oxide semiconductor layer 130b. Therefore, the second oxide semiconductor layer 130b may be referred to as a "channel layer." However, embodiment of the present disclosure is not limited to this case, and the channel may be formed in the first oxide semiconductor layer 130a.

As shown in FIG. 10, a structure of the active layer 130 that includes the first oxide semiconductor layer 130a and the second oxide semiconductor layer 130b may be referred to as a bi-layer structure.

The first oxide semiconductor layer 130a serving as a support layer may have excellent film stability and mechanical characteristics. For film stability, the first oxide semiconductor layer 130a may include Ga. Ga forms a stable bonding with oxygen, and Ga oxide has excellent film stability.

The first oxide semiconductor layer 130a, for example, may include at least one of IGZO(InGaZnO)-based, IGO (InGaO)-based, IGTO(InGaSnO)-based, IGZTO(InGaZnSnO)-based, GZTO(GaZnSnO)-based, GZO(GaZnO)-based or GO(GaO)-based oxide semiconductor materials.

The second oxide semiconductor layer 130b serving as a channel layer, for example, may be made of at least one of IZO(InZnO)-based, IGO(InGaO)-based, ITO(InSnO)- based, IGZO(InGaZnO)-based, IGZTO(InGaZnSnO)-based, GZTO (GaZnSnO)-based or ITZO(InSnZnO)-based oxide semiconductor materials. However, another one embodiment of the present disclosure is not limited to this example, and the second oxide semiconductor layer 130b may be made of another oxide semiconductor material known in the art.

Figure 11:
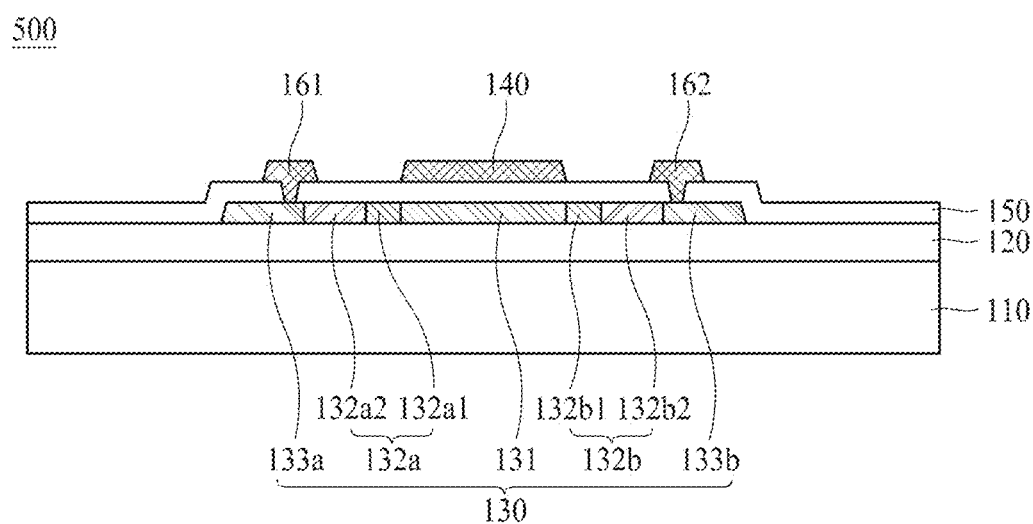
FIG. 11 is a cross-sectional view illustrating a thin film transistor according to another embodiment of the present disclosure.

FIG. 11 is a cross-sectional view illustrating a thin film transistor 500 according to another embodiment of the present disclosure.

The thin film transistor 500 shown in FIG. 11 includes an active layer 130, a gate electrode 140 spaced apart from the active layer 130 to partially overlap the active layer 130, a gate insulating film 150 between the active layer 130 and the gate electrode 140, a source electrode 161 on the gate insulating film 150, and a drain electrode 162 spaced apart from the source electrode 161 and disposed on the gate insulating film 150.

Referring to FIG. 11, the gate insulating film 150 is formed to cover an upper surface of the active layer 130. The source electrode 161 and the drain electrode 162 may be disposed on the same layer as the gate electrode 140, and may be made of the same material as that of the gate electrode 140. Each of the source electrode 161 and the drain electrode 162 is connected with the active layer 130 by a contact hole formed in the gate insulating film 150.

Figure 12A:
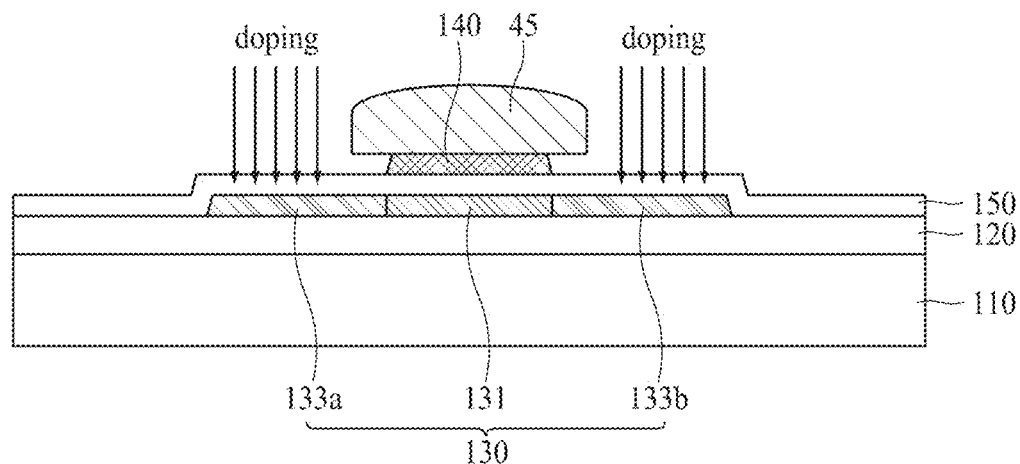
FIG. 12A is a schematic view illustrating a conductorizing method according to a comparison example.

FIG. 12A is a schematic view illustrating a conductorizing method according to a comparison example.

Referring to FIG. 12A, in a state a photoresist pattern 45 remains on the gate electrode 140, conductorization is performed using the photoresist pattern 45 as a mask. Referring to FIG. 12A, the photoresist pattern 45 is partially protruded to the outside of the gate electrode 140.

According to a comparison example, doping for the active layer 130 is performed by doping of one time. Referring to FIG. 12A, after the gate electrode 140 is formed, conductorization is performed by first doping using the photoresist pattern 45 as a mask.

Meanwhile, in order that the thin film transistor is effectively driven at an ON state, the conductorization portions 133a and 133b should be in contact with the channel portion 131. For stable contact between the conductorization portions 133a and 133b and the channel portion 131, the photoresist pattern 45 protruded to the outside of the gate electrode 140 has a limited length.

When the length of the photoresist pattern 45 protruded to the outside of the gate electrode 140 is long, non-conductorization portions may be generated between the channel portion 131 and the conductorization portions 133a and 133b. In this case, a current may not flow through the thin film transistor at the ON state of the thin film transistor. In order to avoid this, for example, 1 µm or so of the photoresist pattern 45 may be protruded to the outside of the gate electrode 140 at both sides of the gate electrode 140.

Since the length of the photoresist pattern 45 is designed for stable contact between the conductorization portions 133a and 133b and the channel portion 131, the edge of the channel portion 131 may be partially conductorized during the conductorizing process.

A distance where the channel portion 131 is conductorized in the conductorizing process will be referred to as a conductorization permeation depth ΔL.

Figure 12B:
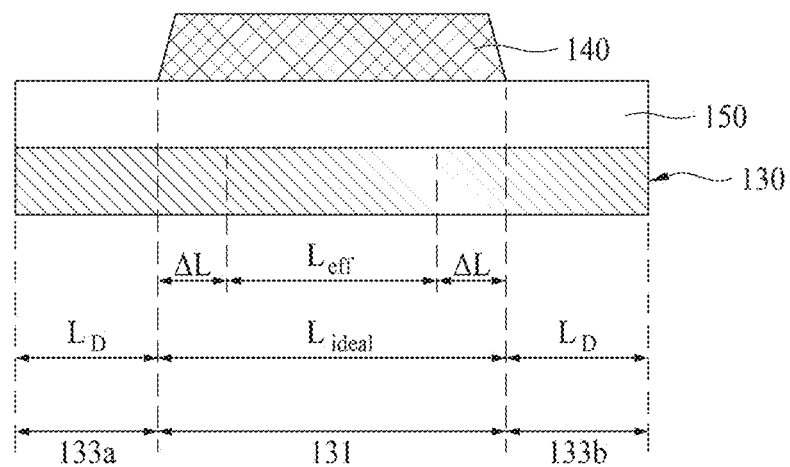
FIG. 12B is a schematic view illustrating a conductorization permeation depth ΔL according to an embodiment.

FIG. 12B is a schematic view illustrating a conductorization permeation depth ΔL.

Referring to FIG. 12B, a length of the channel portion 131 of the active layer 130, which overlaps the gate electrode 140, is marked as "Lideal". "Lideal" of FIG. 12B may be considered as an ideal length of the channel portion 131.

In a selective conductorization process for the active layer 130, the channel portion 131 is partially conductorized, and the conductorized area fails to serve as a channel. A length of the conductorized portion of the channel portion 131 is referred to as a conductorization permeation depth ΔL. Also, a length of an area of the channel portion 131, which may effectively serve as a channel without being conductorized, is referred to as an effective channel length Leff. When the conductorization permeation depth ΔL increases, the effective channel length Leff is reduced.

In order that the thin film transistor serves to perform a switching function, the effective channel length Leff should be maintained at a predetermined value or more. Therefore, when considering the conductorization permeation depth ΔL, the channel portion 131 should be designed with a long length to make sure of a predetermined effective channel length Leff. In this case, the size of the thin film transistor may increase, and it may be difficult to miniaturize and integrate an element.

According to one embodiment of the present disclosure, the gradient portions 132a and 132b are disposed between the channel portion 131 and the conductorization portions 133a and 133b to serve as a buffering function between the channel portion 131 and the conductorization portions 133a and 133b, whereby most of the channel portion 131 may effectively serve as a channel. In this way, according to one embodiment of the present disclosure, since the effective channel length $L_{eff}$ is effectively obtained, it is easy to determine and design the length of the channel portion 131. Also, according to one embodiment of the present disclosure, even though the length of the channel portion 131, which is specified by the length of the gate electrode 140, is designed to be short, the effective channel length $L_{eff}$ required for driving of the thin film transistor may be obtained.

Figure 13:
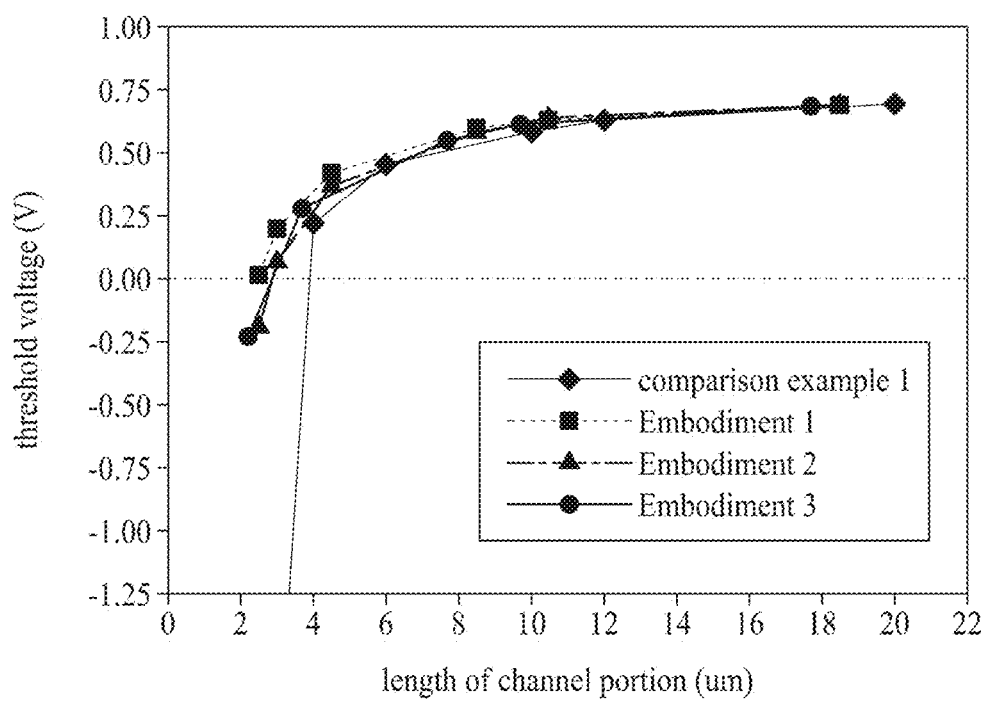
FIG. 13 illustrates a threshold voltage value of a thin film transistor according to a length of a channel portion.

FIG. 13 illustrates a threshold voltage value of a thin film transistor according to a length of the channel portion 131.

In detail, a comparison example 1 of FIG. 13 illustrates a specific threshold voltage in accordance with the length of the channel portion 131 in a thin film transistor manufactured by doping using the photoresist pattern 45 as shown in FIG. 12A. In detail, in the comparison 1, thin film transistors of which photoresist patterns 45 protruded to the outside of the gate electrode 140 have a sum of lengths of 1 µm, which is a sum of a length of a protrusion from a left side and a length of a protrusion from a right side of the gate electrode 140, and channel portions 131 have lengths ranging from 3 µm to 20 µm (3 µm, 4 µm, 6 µm, 10 µm, 12 µm, 20 µm) have been manufactured and then their threshold voltages have been measured. For conductorization, B has been doped, and first doping based on B has been only performed. An acceleration voltage of B for doping is 40 kV, and a doping concentration is $1 \times 10^{15}$ atom/cm$^3$.

Embodiment 1 of FIG. 13 illustrates a specific threshold voltage in accordance with the length of the channel portion 131 in a thin film transistor manufactured by first doping using the photoresist pattern 40 as shown in FIG. 3 and second doping as shown in FIG. 4. In detail, in the Embodiment 1, thin film transistors of which photoresist patterns 40 protruded to the outside of the gate electrode 140 have a sum of lengths of 2.0 µm, which is a sum of a length of a protrusion from a left side and a length of a protrusion from a right side of the gate electrode 140, and channel portions 131 have lengths ranging from 2.5 µm to 20 µm (2.5 µm, 3 µm, 4 µm, 8 µm, 10 µm, 12 µm, 19 µm) have been manufactured and then their threshold voltages have been measured. For conductorization, B has been doped twice. An acceleration voltage of B for first doping is 40 kV, and a doping concentration is $1 \times 10^{15}$ atom/cm³. An acceleration voltage of B for second doping is 40 kV, and a doping concentration is $3 \times 10^{14}$ atom/cm³.

Embodiment 2 of FIG. 13 illustrates a specific threshold voltage in accordance with the length of the channel portion 131 in a thin film transistor manufactured by first doping using the photoresist pattern 40 as shown in FIG. 3 and second doping as shown in FIG. 4. In detail, in the Embodiment 2, thin film transistors of which photoresist patterns 40 protruded to the outside of the gate electrode 140 have a sum of lengths of 2.0 μm, which is a sum of a length of a protrusion from a left side and a length of a protrusion from a right side of the gate electrode 140, and channel portions 131 have lengths ranging from 2.5 μm to 20 μm (2.5 μm, 3 μm, 4 μm, 8 μm, 10 μm, 12 μm, 19 μm) have been manufactured and then their threshold voltages have been measured. For conductorization, B has been doped twice. An acceleration voltage of B for first doping is 40 kV, and a doping concentration is $1 \times 10^{15}$ atom/cm³. An acceleration voltage of B for second doping is 40 kV, and a doping concentration is $4 \times 10^{14}$ atom/cm³.

Embodiment 3 of FIG. 13 illustrates a specific threshold voltage in accordance with the length of the channel portion 131 in a thin film transistor manufactured by first doping using the photoresist pattern 40 as shown in FIG. 3 and second doping as shown in FIG. 4. In detail, in the Embodiment 3, thin film transistors of which photoresist patterns 40 protruded to the outside of the gate electrode 140 have a sum of lengths of 2.8 μm, which is a sum of a length of a protrusion from a left side and a length of a protrusion from a right side of the gate electrode 140, and channel portions 131 have lengths ranging from 2.5 μm to 20 μm (2.5 μm, 3 μm, 4 μm, 8 μm, 10 μm, 12 μm, 18 μm) have been manufactured and then their threshold voltages have been measured. For conductorization, B has been doped twice. An acceleration voltage of B for first doping is 40 kV, and a doping concentration is $1 \times 10^{15}$ atom/cm³. An acceleration voltage of B for second doping is 40 kV, and a doping concentration is $4 \times 10^{14}$ atom/cm³.

Referring to FIG. 13, in case of the comparison example 1, when the length of the channel portion 131 is 3 μm, it is noted that a threshold voltage is not formed in the thin film transistor and the thin film transistor is conductorized. Therefore, in the comparison 1, when the length of the channel portion 131 is 3 μm, the thin film transistor cannot effectively perform a switching function.

On the other hand, in case of the Embodiments 1, 2, and 3 according to the present disclosure, even though the length of the channel portion 131 is 2.5 μm, it is noted that the thin film transistor may have an effective threshold voltage. In case of the Embodiments 1, 2 and 3, it is noted that a threshold voltage increases as the length of the channel portion 131 becomes long. However, in any case, the thin film transistor has a specific threshold voltage, whereby the thin film transistor may effectively perform a switching function.

Hereinafter, a method for manufacturing a thin film transistor 100 according to one embodiment of the present disclosure will be described with reference to FIGS. 14A to 14H.

FIGS. 14A to 14H are process views illustrating a method for manufacturing a thin film transistor 100 according to one embodiment of the present disclosure.

Figure 14A:
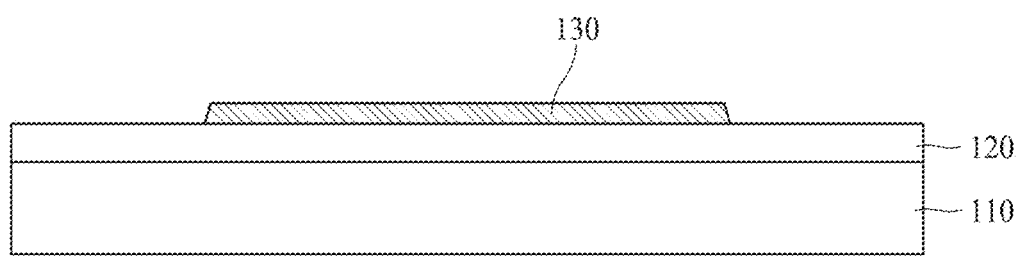
FIGS. 14A to 14H are process views illustrating a method for manufacturing a thin film transistor according to one embodiment of the present disclosure.

Referring to FIG. 14A, the buffer layer 120 is formed on the substrate 110, and the active layer 130 is formed on the buffer layer 120. The active layer 130 includes an oxide semiconductor material. In more detail, the active layer 130 may be an oxide semiconductor layer.

Figure 14B:
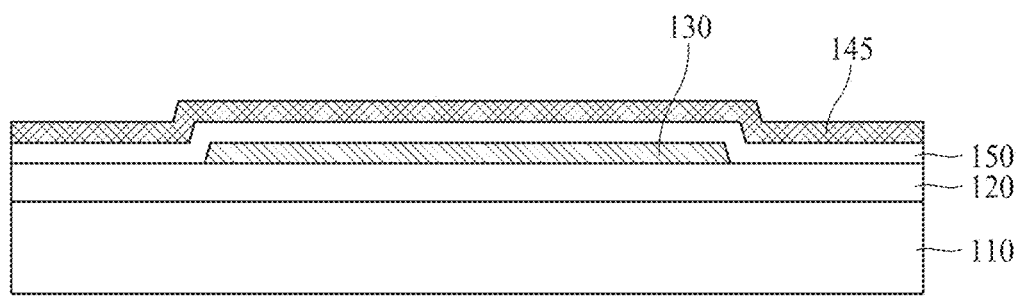

Referring to FIG. 14B, the gate insulating film 150 is formed on the active layer 130. The gate insulating film 150 may cover the entire upper surface of the active layer 130.

Also, referring to FIG. 14B, a material layer 145 for the gate electrode is formed on the gate insulating film 150. The material layer 145 for the gate electrode may include metal.

Figure 14C:
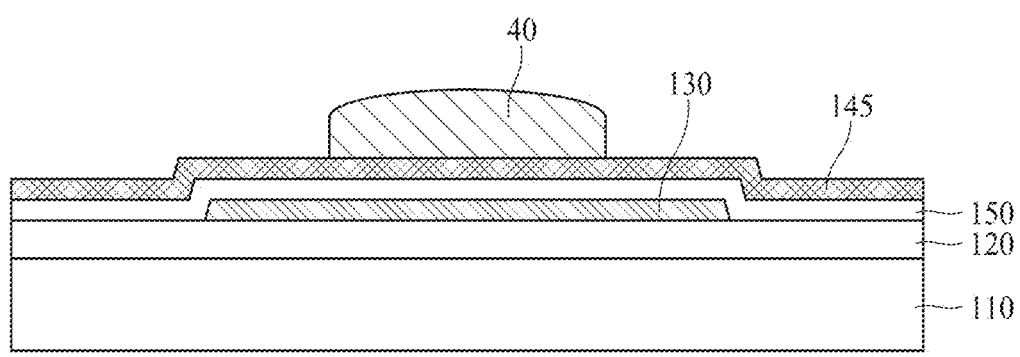

Referring to FIG. 14C, the photoresist pattern 40 is formed on the material layer 145 for the gate electrode. The photoresist pattern 40 may be made by exposure and development of photoresist.

Figure 14D:
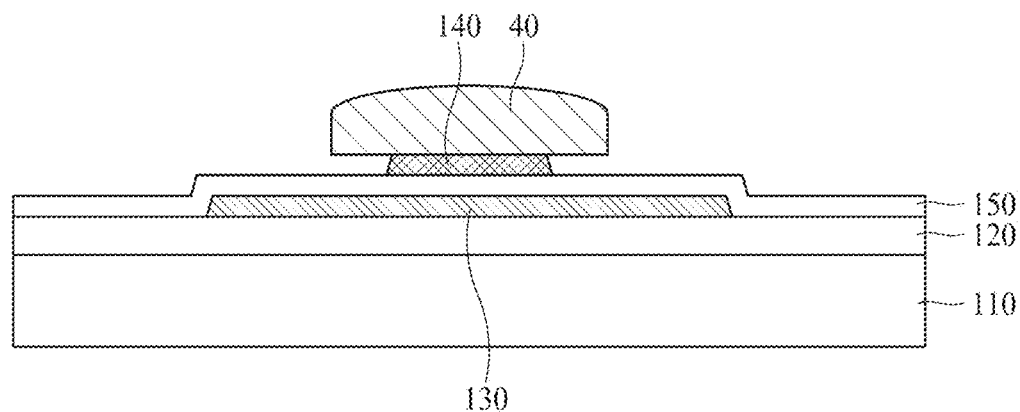

Referring to FIG. 14D, the material layer 145 for the gate electrode is etched using the photoresist pattern 40 as a mask. As a result, the gate electrode 140 is formed.

As shown in FIG. 14D, a size of the photoresist pattern 40 is greater than that of the gate electrode 140 in a plan view. The gate electrode 140 having a size smaller than that of the photoresist pattern 40 may be made by over-etching for the material layer 145 for the gate electrode. The gate electrode 140 may be disposed in an area defined by the photoresist pattern 40 in a plan view.

In a cross-sectional view shown in FIG. 14D, the photoresist pattern 40 is protruded from the gate electrode 140. In detail, the photoresist pattern 40 is formed to be protruded to the outside of the area defined by the gate electrode 140. For example, the photoresist pattern 40 is protruded from the edge of the gate electrode 140 along a line for sequentially connecting the first conductorization portion 133a, the channel portion 131 and the second conductorization portion 133b, which will be formed later, with one another.

Lengths of the photoresist pattern 40 protruded from the gate electrode 140 at both sides of the gate electrode 140 may define lengths of the first gradient portion 132a and the second gradient portion 132b, which will be formed later. According to one embodiment of the present disclosure, a sum of the lengths of the photoresist pattern 40 protruded from the gate electrode 140 at both sides of the gate electrode 140 may range from 1.5 μm to 3.3 μm. According to one embodiment of the present disclosure, "both sides" together denote a left side and a right side based on the gate electrode 140 in the drawing shown in FIG. 14D. According to one embodiment of the present disclosure, a length of any one side of the photoresist pattern 40 protruded from the gate electrode 140 may be 0.7 μm or more.

According to one embodiment of the present disclosure, the gate insulating film 150 may not be patterned in the process of forming the gate electrode 140. Therefore, the gate insulating film 150 may cover the entire upper surface of the active layer 130.

Next, the active layer 130 is doped with the dopant. Doping may be performed by at least two steps.

Figure 14E:
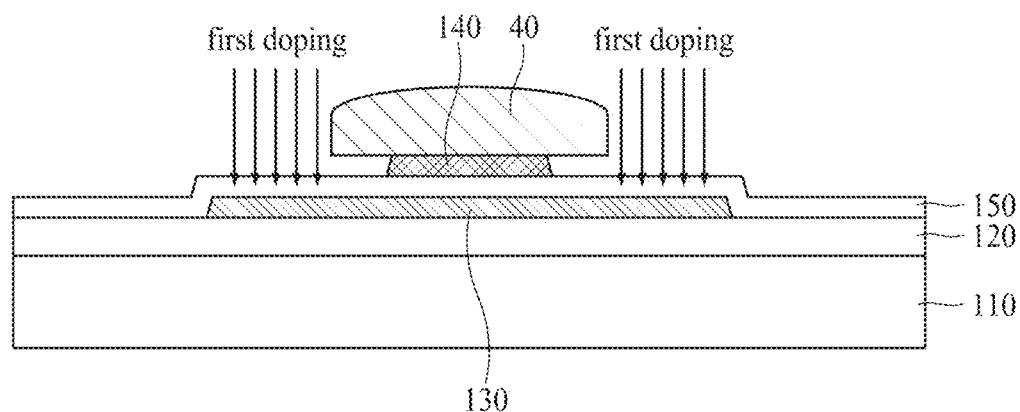

In details, referring to FIG. 14E, the dopant is doped in the active layer 130. Doping shown in FIG. 14E will be referred to as first doping.

Referring to FIG. 14E, the photoresist pattern 40 is used as a mask in the first doping. An area of the active layer 130, which is not protected by the photoresist pattern 40, is selectively doped.

The dopant may include at least one of B, P, F or H. The dopant used for the first doping will be referred to as a first dopant. As the first dopant, at least one of B, P, F or H may be used. The dopant may be doped at an ion state. According to one embodiment of the present disclosure, the first doping may be performed by ion doping through ion implantation.

Figure 14F:
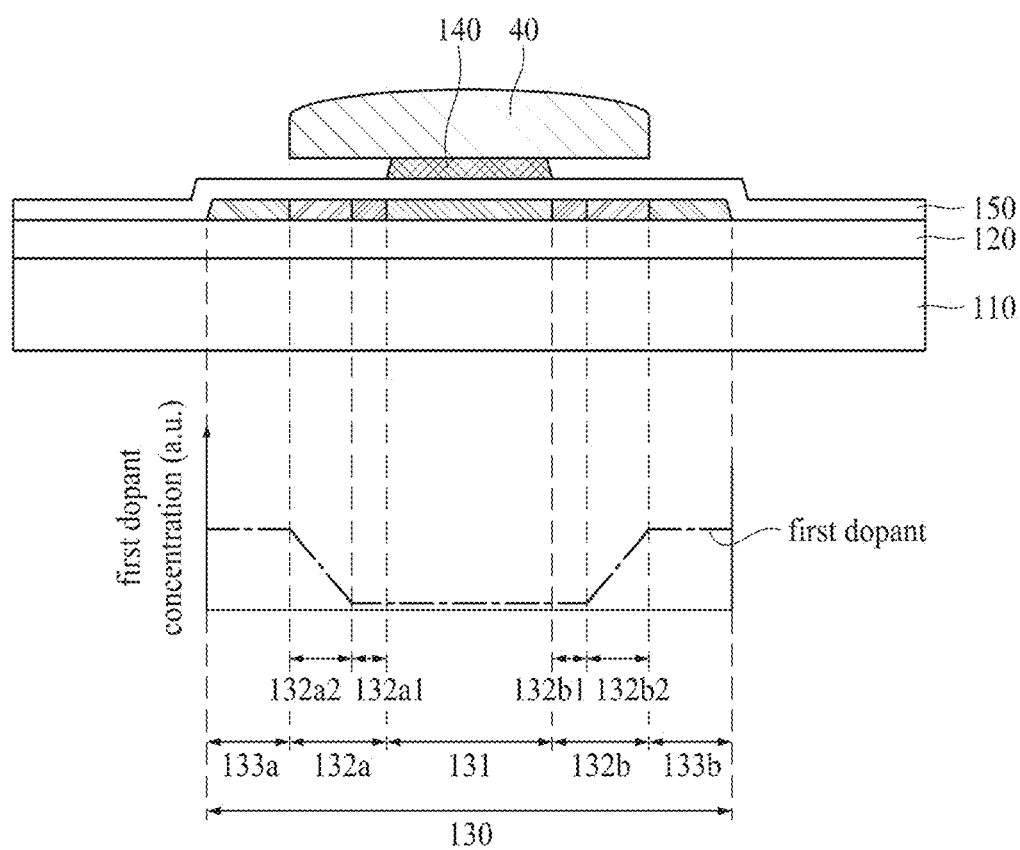

Referring to FIG. 14F, selective conductorization for the active layer 130 is performed by the first doping, and thus the conductorization portions 133a and 133b are formed.

According to one embodiment of the present disclosure, doping is not performed for the channel portion 131 of the active layer 130. As shown in FIG. 14F, the photoresist pattern 40 remaining on the gate electrode 140 may serve as a mask for protecting the channel portion 131 in the first doping process.

Referring to FIGS. 14E and 14F, based on the cross-sectional view, the photoresist pattern 40 has a length longer than that of the gate electrode 140, whereby the gate electrode 140 may fully be overlapped with the photoresist pattern 40. Therefore, the channel portion 131 is efficiently protected from the dopant.

The dopant is not doped in the channel portion 131 protected by the photoresist pattern 40. As a result, the channel portion 131 may maintain semiconductor characteristics.

Referring to FIG. 14F, the gradient portions 132a and 132b are formed in the area protected by the photoresist pattern 40. The dopant is not directly injected into the gradient portions 132a and 132b by the first doping. However, the dopants doped in the conductorization portions 133a and 133b may be diffused to the gradient portions 132a and 132b. Therefore, an effect that the dopant is partially doped in the gradient portions 132a and 132b may be obtained.

The length of each of the gradient portions 132a and 132b corresponds to the length of the photoresist pattern 40 protruded from the gate electrode 140. According to one embodiment of the present disclosure, a sum of the lengths of the first gradient portion 132a and the second gradient portion 132b may range from 1.5 µm to 3.3 µm.

Referring to FIG. 14F, the first dopant may have a concentration gradient in the gradient portions 132a and 132b. In detail, the gradient portions 132a and 132b may include first areas 132a1 and 132b1 that adjoin the channel portion 131, and second areas 132a2 and 132b2 that adjoin the conductorization portions 133a and 133b. The first dopant may have a concentration gradient in the second areas 132a2 and 132b2 of the gradient portions 132a and 132b. The first areas 132a1 and 132b1 of the gradient portions 132a and 132b may not include the first dopant. According to one embodiment of the present disclosure, the areas of the gradient portions 132a and 132b, which do not include the first dopant, are defined as the first areas 132a1 and 132b1.

Figure 14G:
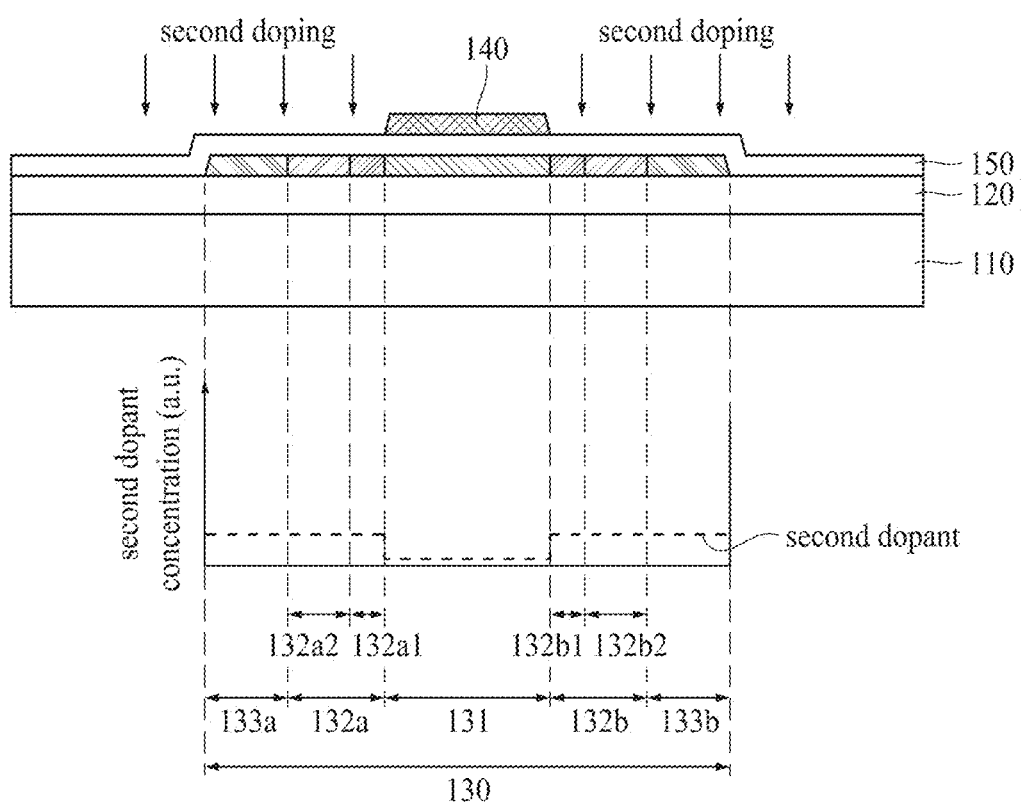

Referring to FIG. 14G, the photoresist pattern 40 is removed after the first doping, and second doping using the gate electrode 140 as a mask is performed. In the second doping, doping is performed at an ion concentration lower than that of the first doping. A doping concentration of the second doping is lower than of the first doping.

As the second dopant for the second doping, at least one of B, P, F or H may be used. According to one embodiment of the present disclosure, the second doping may be performed by ion doping through ion implantation. According to one embodiment of the present disclosure, the second dopant used for the second doping may be equal to or different from the first dopant used for the first doping.

The second doping may be performed for the entire area of the active layer 130 except the area protected by the gate electrode 140. Therefore, in the second doping, the dopant may directly be doped in the gradient portions 132a and 132b. However, since the ion concentration of the second doping is low, the second dopant is not diffused to the channel portion 131, or is little diffused. As shown in FIG. 14G, the concentration of the second dopant may be equal for the entire doping areas except the channel portion 131. According to one embodiment of the present disclosure, the second doping does not conductorize the channel portion 131.

Figure 14H:
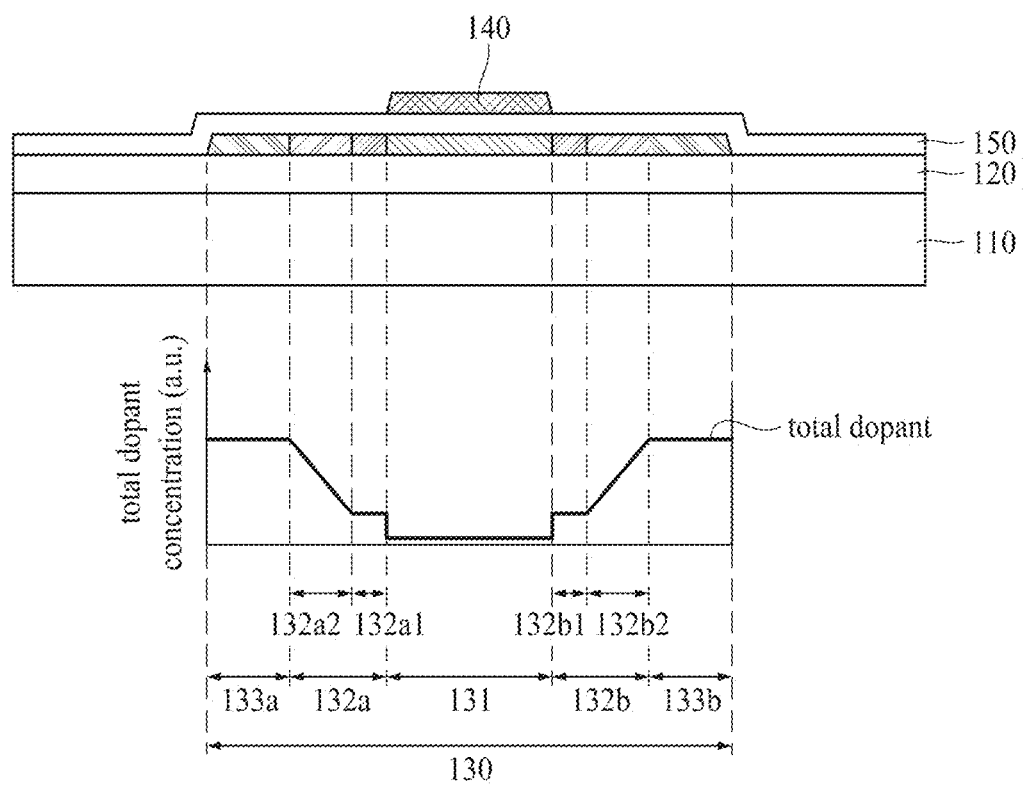

Referring to FIG. 14H, as a result of such doping, the conductorization portions 133a and 133b are formed.

According to one embodiment of the present disclosure, the buffer layer 120 may also be doped with the dopant during the doping process.

The dopant concentration of the active layer 130 may be higher than that of the gate insulating film 150 and that of the buffer layer 120. Alternatively, the dopant concentration of the buffer layer 120 may be higher than that of the active layer 130 and that of the gate insulating film 150.

The thin film transistor 100 shown in FIG. 14H is formed by the first doping and the second doping. The total dopant concentration of the thin film transistor 100 is as shown in FIG. 14H. The total dopant concentration of the thin film transistor 100 may be referred to as the dopant concentration of the thin film transistor 100. Since the dopant concentration of the thin film transistor 100 has been already described, its detailed description will be omitted.

Figure 15:
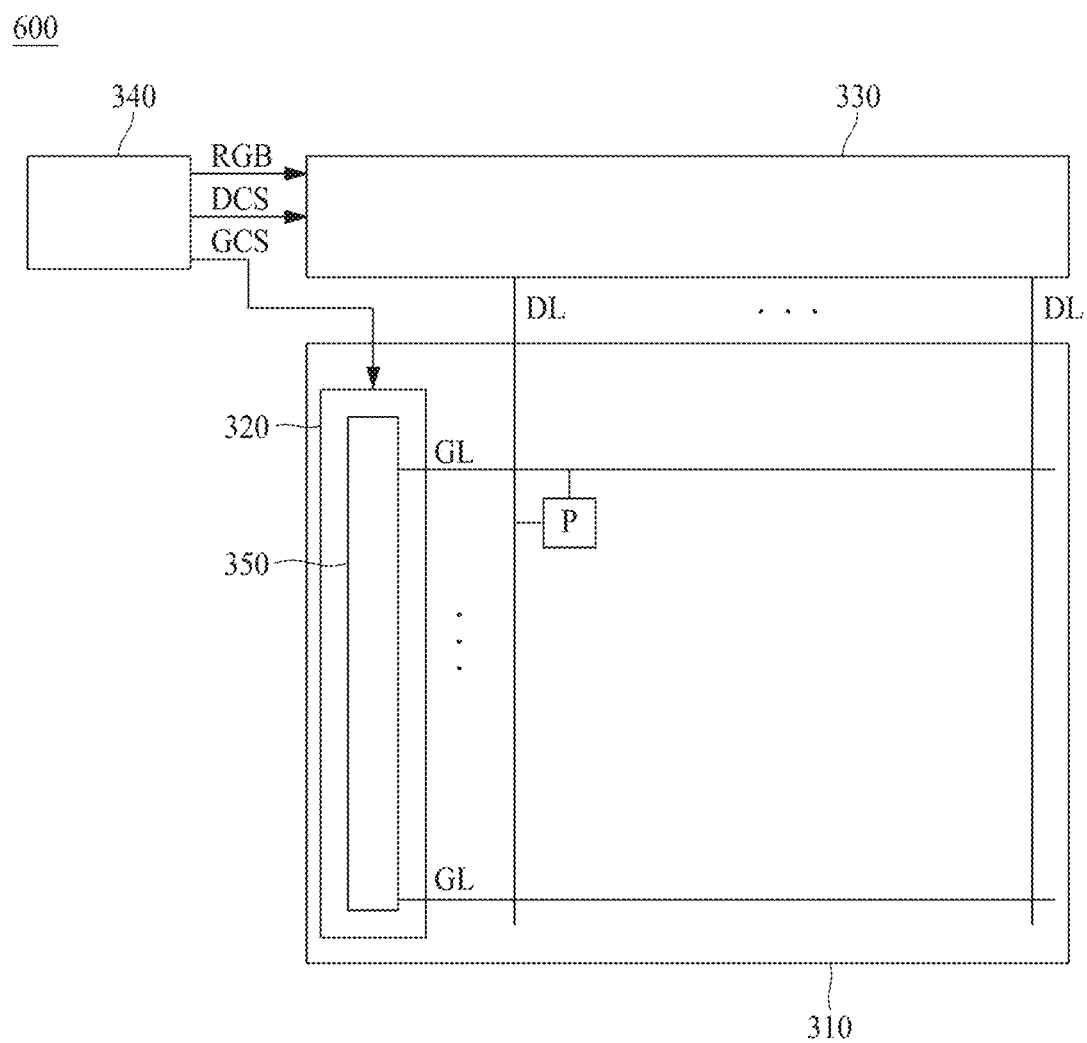
FIG. 15 is a schematic view illustrating a display device according to another embodiment of the present disclosure.

FIG. 15 is a schematic view illustrating a display device 600 according to another embodiment of the present disclosure.

The display device 600 according to another embodiment of the present disclosure, as shown in FIG. 15, includes a display panel 310, a gate driver 320, a data driver 330 and a controller 340.

The display panel 310 includes gate lines GL, data lines DL, pixels P disposed in intersection areas between the gate lines GL and the data lines DL. The pixel P includes a display element, and a pixel driving circuit for driving the display element. An image is displayed by driving of the pixel P.

The controller 340 controls the gate driver 320 and the data driver 330.

The controller 340 outputs a gate control signal GCS for controlling the gate driver 320 and a data control signal DCS for controlling the data driver 330 by using a synchronization signal and a clock signal, which are supplied from an external system (not shown). Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst, and a gate clock GCLK. Also, control signals for controlling a shift register 350 may be included in the gate control signal GCS.

The data control signal DCS includes a source start pulse SSP, a source shift clock signal SSC, a source output enable signal SOE, and a polarity control signal POL.

The data driver 330 supplies a data voltage to the data lines DL of the display panel 310. In detail, the data driver 330 converts the image data RGB input from the controller 340 to an analog data voltage and supplies a data voltage of one horizontal line to the data lines DL every first horizontal period where a gate pulse is supplied to the gate line GL.

The gate driver 320 includes a shift register 350.

The shift register 350 sequentially supplies gate pulses to the gate lines GL for one frame by using the start signal and the gate clock, which are transmitted from the controller 340.

In this case, one frame means a period where one image is output through the display panel 310. The gate pulse has a turn-on voltage for turning on a switching element (thin film transistor) disposed in the pixel P.

Also, the shift register 350 supplies a gate-OFF signal capable of turning off a switching element, to the gate line GL for the other period of one frame, in which the gate pulse is not supplied. Hereinafter, the gate pulse and the gate-OFF signal will collectively be referred to as a scan signal SS or Scan.

According to one embodiment of the present disclosure, the gate driver 320 may be packaged on the display panel 310. In this way, a structure in which the gate driver 320 is directly packaged on the display panel 310 will be referred to as a Gate In Panel (GIP) structure. The gate driver 320 may include at least one of the thin film transistors 100, 200, 300, 400 or 500 shown in FIG. 1 and FIGS. 8 to 11.

Figure 16:
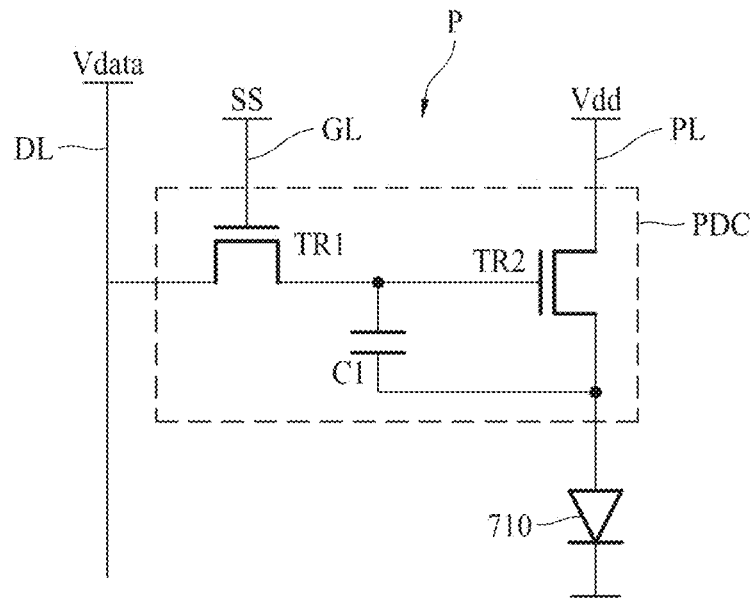
FIG. 16 is a circuit diagram of any one pixel in FIG. 15 according to an embodiment.

FIG. 16 is a circuit diagram illustrating any one pixel P of FIG. 15 according to an embodiment.

The circuit diagram of FIG. 16 is an equivalent circuit diagram for a pixel P of a display device 600 that includes an organic light emitting diode OLED as a display element 710.

The pixel P includes a display element 710, and a pixel driving circuit PDC for driving the display element 710.

The pixel driving circuit PDC of FIG. 16 includes a first thin film transistor TR1 that is a switching transistor, and a second thin film transistor TR2 that is a driving transistor. Each of the thin film transistors 100, 200, 300, 400, and 500 shown in FIG. 1 and FIGS. 8 to 11 may be used as the first thin film transistor TR1 or the second thin film transistor TR2.

The first thin film transistor TR1 is connected to the gate line GL and the data line DL, and is turned on or off by the scan signal SS supplied through the gate line GL.

The data line DL provides a data voltage Vdata to the pixel driving circuit PDC, and the first thin film transistor TR1 controls applying of the data voltage Vdata.

A driving power line PL provides a driving voltage Vdd to the display element 710, and the second thin film transistor TR2 controls applying of the driving voltage Vdd. The driving voltage Vdd is a pixel driving voltage for driving the organic light emitting diode OLED that is the display element 710.

When the first thin film transistor TR1 is turned on by the scan signal SS applied from the gate driver 320 through the gate line GL, the data voltage Vdata supplied through the data line DL is supplied to a gate electrode of the second thin film transistor TR2 connected with the display element 710. The data voltage Vdata is charged in a first capacitor C1 formed between the gate electrode and a source electrode of the second thin film transistor TR2. The first capacitor C1 is a storage capacitor Cst.

The amount of a current supplied to the organic light emitting diode OLED that is the display element 710 through the second thin film transistor TR2 is controlled in accordance with the data voltage Vdata, whereby gradation of light emitted from the display element 710 may be controlled.

Figure 17:
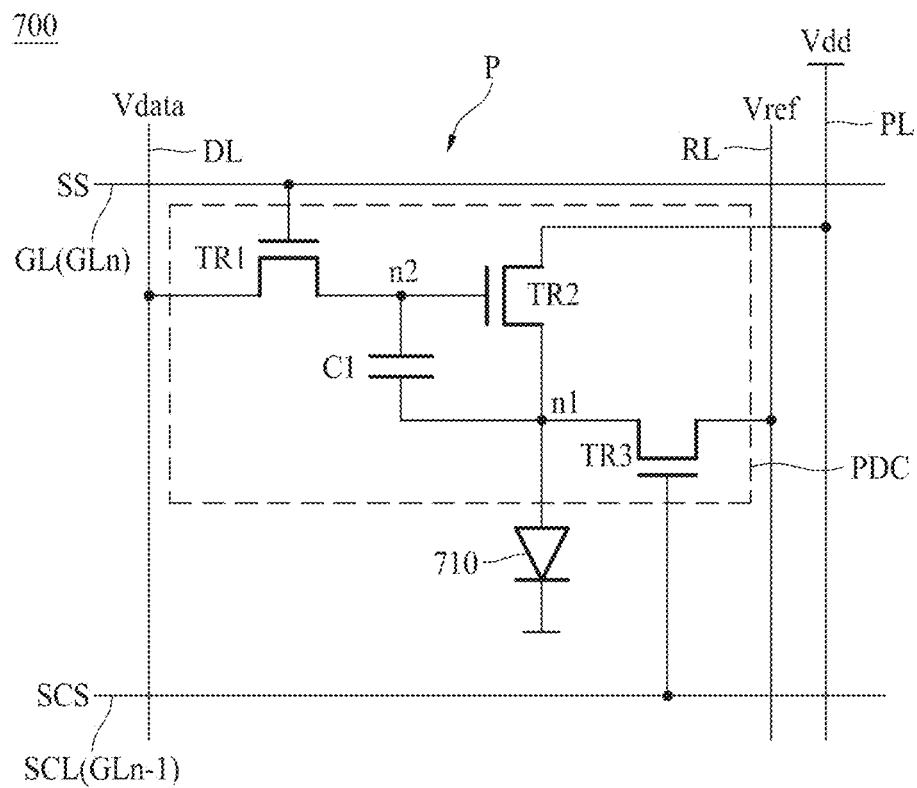
FIG. 17 is a circuit diagram illustrating any one pixel of a display device according to another embodiment of the present disclosure.

FIG. 17 is a circuit diagram illustrating any one pixel P of a display device 700 according to still another embodiment of the present disclosure.

The pixel P of the display device 700 shown in FIG. 17 includes an organic light emitting diode (OLED) that is a display element 710, and a pixel driving circuit PDC for driving the display element 710. The display element 710 is connected with the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

Referring to FIG. 17, assuming that a gate line of an nth pixel P is "$GL_n$", a gate line of a (n−1)th pixel P adjacent to the nth pixel P is "$GL_{n-1}$", and the gate line "$GL_{n-1}$" of the (n−1)th pixel P serves as a sensing control line SCL of the nth pixel P.

The pixel driving circuit PDC, for example, includes a first thin film transistor TR1 (switching transistor) connected with the gate line GL and the data line DL, a second thin film transistor TR2 (driving transistor) for controlling a magnitude of a current output to the display element 710 in accordance with the data voltage Vdata transmitted through the first thin film transistor TR1, and a third thin film transistor TR3 (reference transistor) for sensing characteristics of the second thin film transistor TR2.

A first capacitor C1 is disposed between a gate electrode of the second thin film transistor TR2 and the display element 710. The first capacitor C1 is referred to as a storage capacitor Cst.

The first thin film transistor TR1 is turned on by the scan signal SS supplied to the gate line GL to transmit the data voltage Vdata, which is supplied to the data line DL, to the gate electrode of the second thin film transistor TR2.

The third thin film transistor TR3 is connected to a first node n1 between the second thin film transistor TR2 and the display element 710 and the reference line RL and thus turned on or off by the sensing control signal SCS, and senses characteristics of the second thin film transistor TR2, which is a driving transistor, for a sensing period.

A second node n2 connected with the gate electrode of the second thin film transistor TR2 is connected with the first thin film transistor TR1. The first capacitor C1 is formed between the second node n2 and the first node n1.

When the first thin film transistor TR1 is turned on, the data voltage Vdata supplied through the data line DL is supplied to the gate electrode of the second thin film transistor TR2. The data voltage Vdata is charged in the first capacitor C1 formed between the gate electrode and the source electrode of the second thin film transistor TR2.

When the second thin film transistor TR2 is turned on, the current is supplied to the display element 710 through the second thin film transistor TR2 in accordance with the driving voltage Vdd for driving the pixel, whereby light is output from the display element 710.

At least one of the first thin film transistor TR1, the second thin film transistor TR2 or the third thin film transistor TR3 of FIG. 17 may have the same structure as that of any one of the thin film transistors 100, 200, 300, 400 and 500 shown in FIG. 1 and FIGS. 8 to 11.

Figure 18:
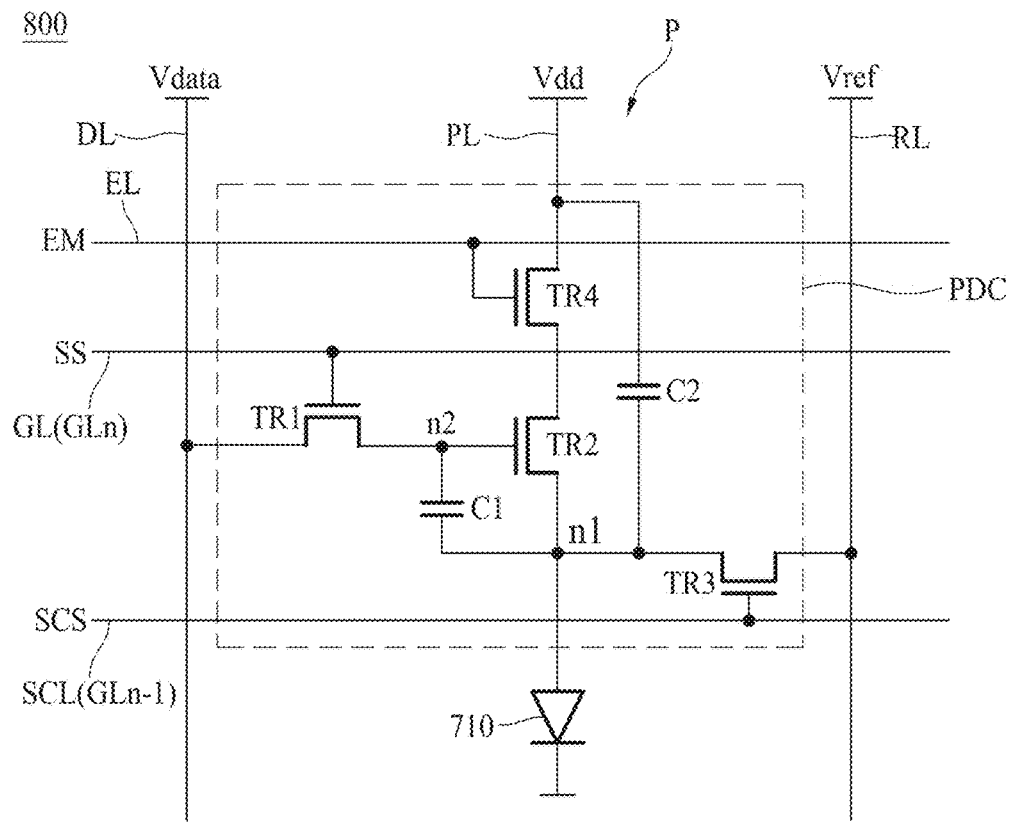
FIG. 18 is a circuit diagram illustrating any one pixel of a display device according to another embodiment of the present disclosure.

FIG. 18 is a circuit diagram illustrating any one pixel of a display device 800 according to further still another embodiment of the present disclosure.

The pixel P of the display device 800 shown in FIG. 18 includes an organic light emitting diode (OLED) that is a display element 710, and a pixel driving circuit PDC for driving the display element 710. The display element 710 is connected with the pixel driving circuit PDC.

The pixel driving circuit PDC includes thin film transistors TR1, TR2, TR3, and TR4.

In the pixel P, signal lines DL, EL, GL, PL, SCL, and RL for supplying a driving signal to the pixel driving circuit PDC are disposed.

In comparison with the pixel P of FIG. 17, the pixel P of FIG. 18 further includes an emission control line EL. An emission control signal EM is supplied to the emission control line EL.

Also, the pixel driving circuit PDC of FIG. 18 further includes a fourth thin film transistor TR4 that is an emission control transistor for controlling a light emission timing of the display element 710, in comparison with the pixel driving circuit PDC of FIG. 17.

Referring to FIG. 18, assuming that a gate line of an nth pixel P is "GLn", a gate line of a (n−1)th pixel P adjacent to the nth pixel P is "GLn−1", and the gate line "GLn−1" of the (n−1)th pixel P serves as a sensing control line SCL of the nth pixel P.

A first capacitor C1 is disposed between the gate electrode of the second thin film transistor TR2 and the display element 710. A second capacitor C2 is disposed between one of terminals of the fourth thin film transistor TR4, to which a driving voltage Vdd is supplied, and one electrode of the display element 710.

The first thin film transistor TR1 is turned on by the scan signal SS supplied to the gate line GL to transmit the data voltage Vdata, which is supplied to the data line DL, to the gate electrode of the second thin film transistor TR2.

The third thin film transistor TR3 is connected to the reference line RL and thus turned on or off by the sensing control signal SCS, and senses characteristics of the second thin film transistor TR2, which is a driving transistor, for a sensing period.

The fourth thin film transistor TR4 transfers the driving voltage Vdd to the second thin film transistor TR2 in accordance with the emission control signal EM, or shields the driving voltage Vdd. When the fourth thin film transistor TR4 is turned on, a current is supplied to the second thin film transistor TR2, whereby light is output from the display element 710.

At least one of the first thin film transistor TR1, the second thin film transistor TR2, the third thin film transistor TR3, or the fourth thin film transistor TR4 of FIG. 18 may have the same structure as that of any one of the thin film transistors 100, 200, 300, 400, and 500 shown in FIG. 1 and FIGS. 8 to 11.

The pixel driving circuit PDC according to another embodiment of the present disclosure may be formed in various structures in addition to the above-described structure. The pixel driving circuit PDC, for example, may include five or more thin film transistors.

Figure 19:
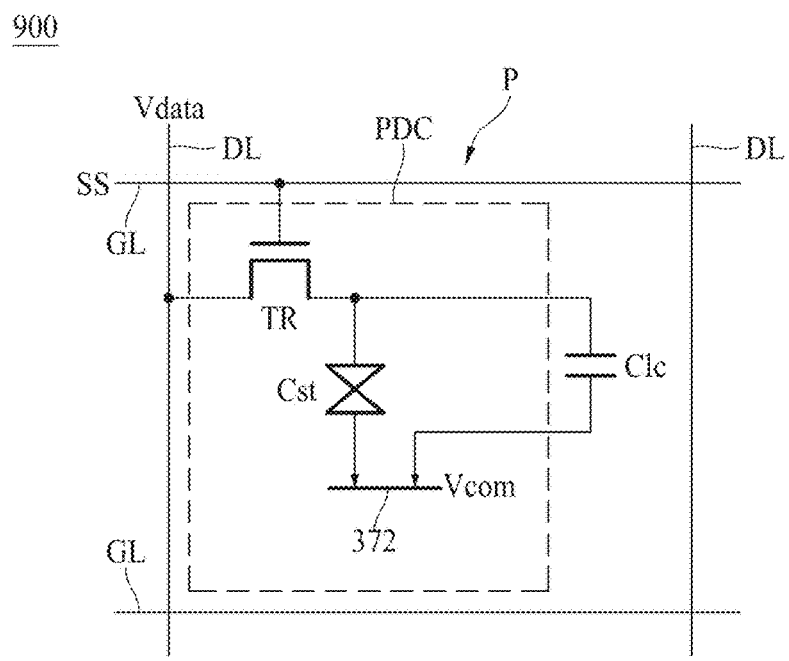
FIG. 19 is a circuit diagram illustrating any one pixel of a display device according to another embodiment of the present disclosure.

FIG. 19 is a circuit diagram illustrating any one pixel P of a display device 900 according to further still another embodiment of the present disclosure.

The display device 900 of FIG. 19 is a liquid crystal display device.

The pixel P of the display device 900 shown in FIG. 19 includes a pixel driving circuit PDC, and a liquid crystal capacitor Clc connected with the pixel driving circuit PDC. The liquid crystal capacitor Clc corresponds to a display element.

The pixel driving circuit PDC includes a thin film transistor TR connected with the gate line GL and the data line DL, and a storage capacitor Cst connected between the thin film transistor TR and a common electrode 372. The liquid crystal capacitor Clc is connected with the storage capacitor Cst between the thin film transistor TR and the common electrode 372 in parallel.

The liquid crystal capacitor Clc is charged with a differential voltage between a data signal supplied to a pixel electrode through the thin film transistor TR and a common voltage Vcom supplied to the common electrode 372, and controls a light-transmissive amount by driving liquid crystals in accordance with the charged voltage. The storage capacitor Cst stably maintains the voltage charged in the liquid crystal capacitor Clc.

The thin film transistor TR of FIG. 19 may have the same structure as that of any one of the thin film transistors 100, 200, 300, 400, and 500 shown in FIG. 1 and FIGS. 8 to 11.

According to one embodiment of the present disclosure, a gradient portion may be formed between a channel portion and a conductorization portion of an active layer by first doping using a photoresist pattern as a mask and second doping using a gate electrode as a mask, and a thin film transistor having a short channel may be designed due to the gradient portion.

According to another embodiment of the present disclosure, the active layer of the thin film transistor has a gradient portion, whereby stability of the channel portion and driving stability of the thin film transistor are obtained.

According to another embodiment of the present disclosure, since a length of a channel may be reduced, the thin film transistor may be manufactured in a small size. This thin film transistor may be disposed by being integrated in various electronic products, and when this thin film transistor is used, a display device of high resolution may be manufactured.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A thin film transistor comprising:
   an active layer;
   a gate electrode spaced apart from the active layer and partially overlapped with the active layer; and
   a gate insulating film between the active layer and the gate electrode, wherein the active layer includes:
      a channel portion overlapped with the gate electrode;
      a conductorization portion which is not overlapped with the gate electrode; and
      a gradient portion between the channel portion and the conductorization portion and not overlapped with the gate electrode,
   the conductorization portion and the gradient portion of the active layer are doped with a dopant,
   the gate insulating film covers an upper surface of the active layer facing the gate electrode during doping of the active layer, and
   in the gradient portion, a concentration of the dopant increases along a direction from the channel portion toward the conductorization portion, wherein the gradient portion includes a first area adjoining the channel portion and a second area adjoining the conductorization portion, the first area including a first portion adjoining the channel portion and a second portion adjoining the second area, and wherein a concentration gradient of the dopant in the first portion of the first area is greater than a concentration gradient of the dopant in the second area, wherein a concentration gradient of the dopant in the second portion of the first area is smaller than the concentration gradient of the dopant in the second area, wherein the first area has a concentration profile of a stair shape.

2. A thin film transistor comprising:

an active layer;

a gate electrode spaced apart from the active layer and partially overlapped with the active layer; and a gate insulating film between the active layer and the gate electrode, wherein the active layer includes:
  a channel portion overlapped with the gate electrode;
  a conductorization portion which is not overlapped with the gate electrode; and
  a gradient portion between the channel portion and the conductorization portion and not overlapped with the gate electrode,
  the conductorization portion and the gradient portion of the active layer are doped with a dopant, the gate insulating film covers an upper surface of the active layer facing the gate electrode during doping of the active layer, and in the gradient portion, a concentration of the dopant increases along a direction from the channel portion toward the conductorization portion, wherein the gradient portion includes a first area adjoining the channel portion and a second area adjoining the conductorization portion, the first area including a first portion adjoining the channel portion and a second portion adjoining the second area, and wherein a first concentration gradient of the dopant in the first portion of the first area is greater than a second concentration gradient of the dopant in the second area, and the second concentration gradient is greater than a third concentration gradient of the dopant in the second portion of the first area.

3. The thin film transistor of claim 2, wherein the second portion of the first area does not have a concentration gradient of the dopant.

4. The thin film transistor of claim 2, wherein the concentration gradient of the dopant is uniform in the second area.

5. The thin film transistor of claim 2, wherein specific resistance of the gradient portion is lower than specific resistance of the channel portion and higher than specific resistance of the conductorization portion.

6. The thin film transistor of claim 2, wherein the dopant includes at least one of B, P, F or H.

7. The thin film transistor of claim 2, wherein the active layer includes an oxide semiconductor material.

8. The thin film transistor of claim 2, wherein the active layer includes:
  a first oxide semiconductor layer; and
  a second oxide semiconductor layer on the first oxide semiconductor layer.

9. A display device comprising the thin film transistor according to claim 2.

10. The thin film transistor of claim 2, further comprising a source electrode and a drain electrode, which are spaced apart from each other and respectively connected with the active layer.

11. The thin film transistor of claim 10, wherein the source electrode and the drain electrode are disposed on a same layer as the gate electrode, and are made of a same material as that of the gate electrode.

12. The thin film transistor of claim 2, further comprising a substrate, and a buffer layer disposed between the substrate and the active layer, wherein the buffer layer includes the dopant.

13. The thin film transistor of claim 12, wherein, in an area overlapped with the conductorization portion, a maximum dopant concentration of the buffer layer is higher than a dopant concentration of the conductorization portion and a dopant concentration of the gate insulating film.

14. The thin film transistor of claim 12, wherein, in an area overlapped with the conductorization portion, a maximum dopant concentration of the conductorization portion is higher than a dopant concentration of the gate insulating film and a dopant concentration of the buffer layer.

15. The thin film transistor of claim 2, wherein the dopant includes a first dopant and a second dopant, and the first dopant has a concentration gradient in the gradient portion.

16. The thin film transistor of claim 15, wherein a concentration of the second dopant is uniform in the conductorization portion and the gradient portion.

17. The thin film transistor of claim 15, wherein the gradient portion includes a first area adjoining the channel portion and a second area adjoining the conductorization portion, and the first area does not include the first dopant.

18. The thin film transistor of claim 15, wherein the first dopant is injected to the conductorization portion and diffused to the gradient portion.

19. The thin film transistor of claim 15, wherein the second dopant is injected to the conductorization portion and the gradient portion.

20. The thin film transistor of claim 15, wherein a concentration of the second dopant is smaller than a concentration of the first dopant in the conductorization portion.

21. A method for manufacturing a thin film transistor, the method comprising:
  forming an active layer;
  forming a gate insulating film on the active layer;
  forming a gate electrode partially overlapped with the active layer, the gate electrode formed on the gate insulating film through a patterning process using a photoresist pattern; and
  doping a dopant on the active layer,
  wherein the gate insulating film covers an upper surface of the active layer facing the gate electrode during doping of the active layer,
  the gate electrode is disposed in an area defined by the photoresist pattern in a plan view, and
  doping the dopant on the active layer further includes:
    first doping using the photoresist pattern as a mask, wherein the photoresist pattern is on the gate electrode and protrudes further than a side of the gate electrode; and
    second doping using the gate electrode as a mask after removing the photoresist pattern.

22. The method of claim 21, wherein a sum of lengths of the photoresist pattern protruded from the gate electrode at both sides of the gate electrode ranges from 1.5 μm to 3.3 μm.

23. The method of claim 21, wherein the dopant includes at least one of B, P, F or H.

24. The method of claim 21, wherein a dopant used for the first doping and a dopant used for the second doping are same with each other.

25. The method of claim 21, wherein a dopant used for the first doping and a dopant used for the second doping are different from each other.

26. The method of claim 21, wherein a doping concentration of the second doping is lower than a doping concentration of the first doping.

* * * * *